United States Patent
Kondo

(10) Patent No.: US 10,861,910 B2
(45) Date of Patent: Dec. 8, 2020

(54) ORGANIC EL DISPLAY PANEL AND METHOD FOR MANUFACTURING ORGANIC EL DISPLAY PANEL

(71) Applicant: JOLED INC., Tokyo (JP)

(72) Inventor: Yoshiaki Kondo, Tokyo (JP)

(73) Assignee: JOLED INC., Tokyo (JP)

( * ) Notice: Subject to any disclaimer, the term of this patent is extended or adjusted under 35 U.S.C. 154(b) by 11 days.

(21) Appl. No.: 16/124,194

(22) Filed: Sep. 7, 2018

(65) Prior Publication Data

US 2019/0081116 A1 Mar. 14, 2019

(30) Foreign Application Priority Data

Sep. 8, 2017 (JP) ................................. 2017-173541

(51) Int. Cl.
*H01L 27/32* (2006.01)
*H01L 51/56* (2006.01)
(Continued)

(52) U.S. Cl.
CPC ...... *H01L 27/3246* (2013.01); *H01L 27/3211* (2013.01); *H01L 27/3218* (2013.01); *H01L 51/56* (2013.01); *G09G 3/3225* (2013.01); *G09G 3/3233* (2013.01); *G09G 2300/0426* (2013.01); *G09G 2300/0452* (2013.01); *H01L 27/322* (2013.01); *H01L 27/3216* (2013.01); *H01L 51/001* (2013.01); *H01L 51/0005* (2013.01); *H01L 51/5012* (2013.01);
(Continued)

(58) Field of Classification Search
CPC ............. H01L 27/3246; H01L 27/3211; H01L 27/3218; H01L 51/56; H01L 2251/558; H01L 27/3216; H01L 2251/5315; H01L 51/001; H01L 51/5072; H01L 51/5056; H01L 51/5088; H01L 27/322; H01L 51/5012; H01L 51/0005; G09G 3/3233; G09G 2300/0426; G09G 3/3225; G09G 2300/0452
See application file for complete search history.

(56) References Cited

U.S. PATENT DOCUMENTS 5,443,922 A 8/1995 Nishizaki et al.
2007/0200488 A1 8/2007 Ito
(Continued)

FOREIGN PATENT DOCUMENTS

JP H5-163488 A 6/1993
JP 2007-234232 A 9/2007

*Primary Examiner* — Su C Kim
(74) *Attorney, Agent, or Firm* — Hauptman Ham, LLP

(57) ABSTRACT

An organic EL display panel including pixel electrodes above a substrate in a matrix, column banks above the substrate at least between edges of the pixel electrodes in a row direction, extending in a column direction and side-by-side in the row direction, organic light emitting layers continuous in the column direction in gaps between the column banks, and a counter electrode layer above the organic light emitting layers. Width in the row direction of the organic light emitting layers, which is defined by width of the gaps between the column banks, changes at intervals in the column direction. For each of the light emitting layers, a minimum interval is equal to or less than a pitch in the column direction of the pixel electrodes and the changes are different from others of the light emitting layers.

10 Claims, 17 Drawing Sheets

(51) Int. Cl.
H01L 51/00 (2006.01)
H01L 51/50 (2006.01)
G09G 3/3225 (2016.01)
G09G 3/3233 (2016.01)

(52) U.S. Cl.
CPC ...... *H01L 51/5056* (2013.01); *H01L 51/5072* (2013.01); *H01L 51/5088* (2013.01); *H01L 2251/5315* (2013.01); *H01L 2251/558* (2013.01)

(56) References Cited

U.S. PATENT DOCUMENTS

| | | | | |
|---|---|---|---|---|
| 2014/0306198 A1* | 10/2014 | Im | ................ | H01L 51/0013 257/40 |
| 2015/0053948 A1* | 2/2015 | Matsushima | ....... | H01L 51/0004 257/40 |
| 2016/0079323 A1* | 3/2016 | Choi | ................ | H01L 27/3246 257/40 |

* cited by examiner

FIG. 13A
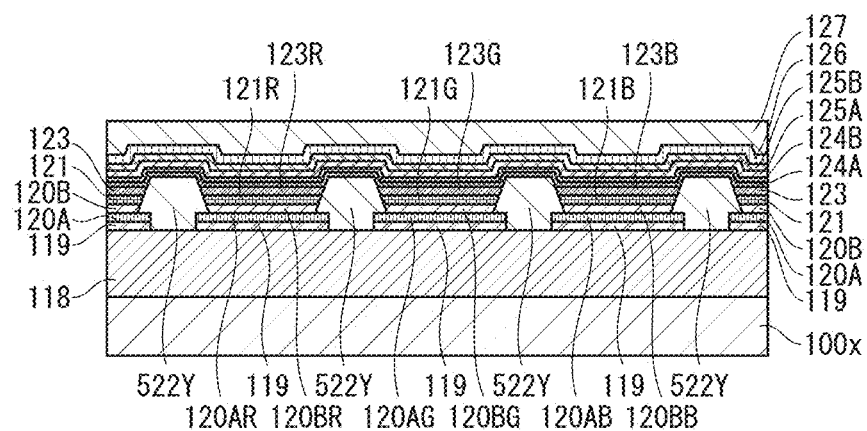
FIG. 13B
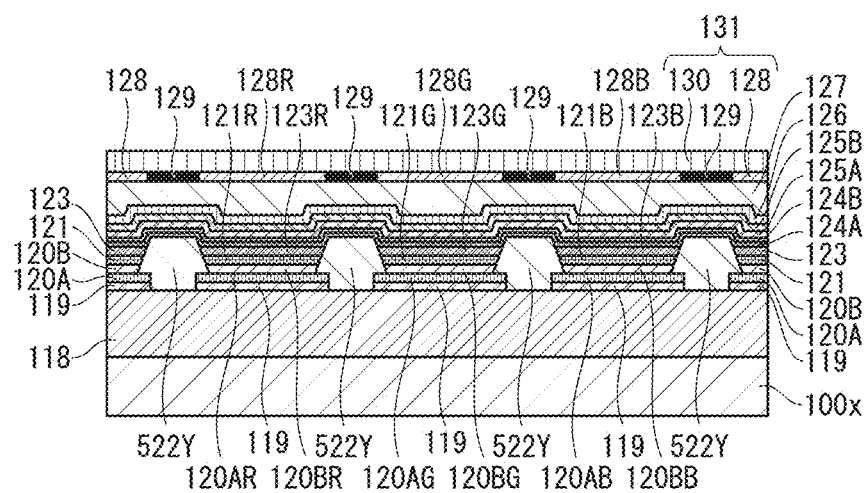
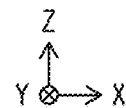

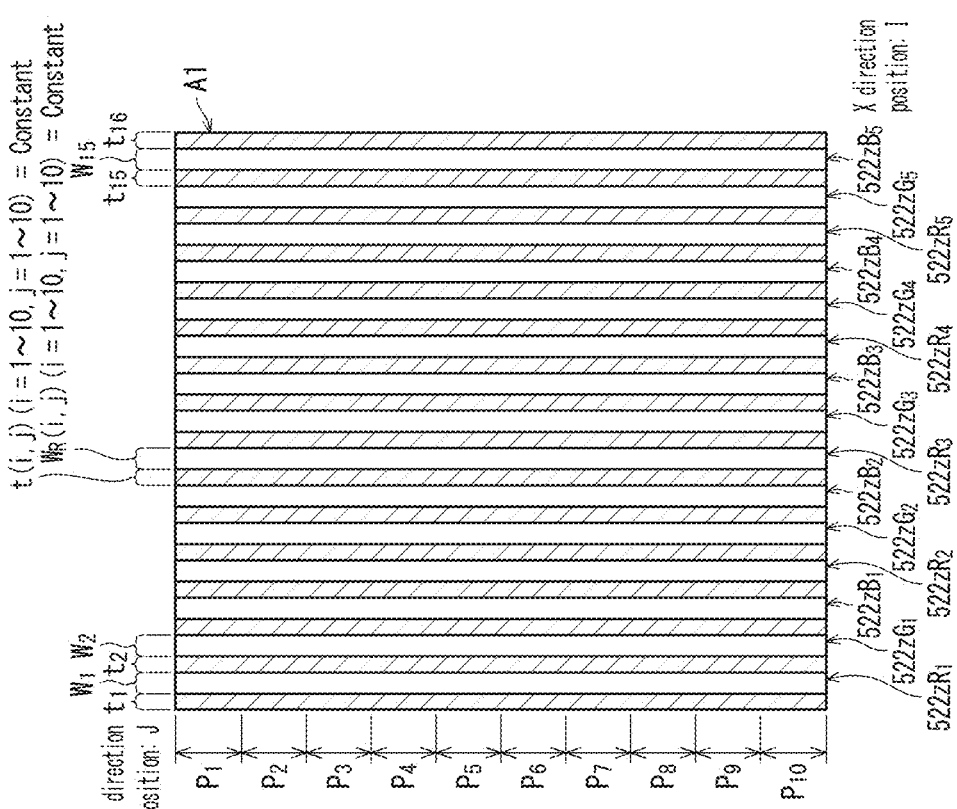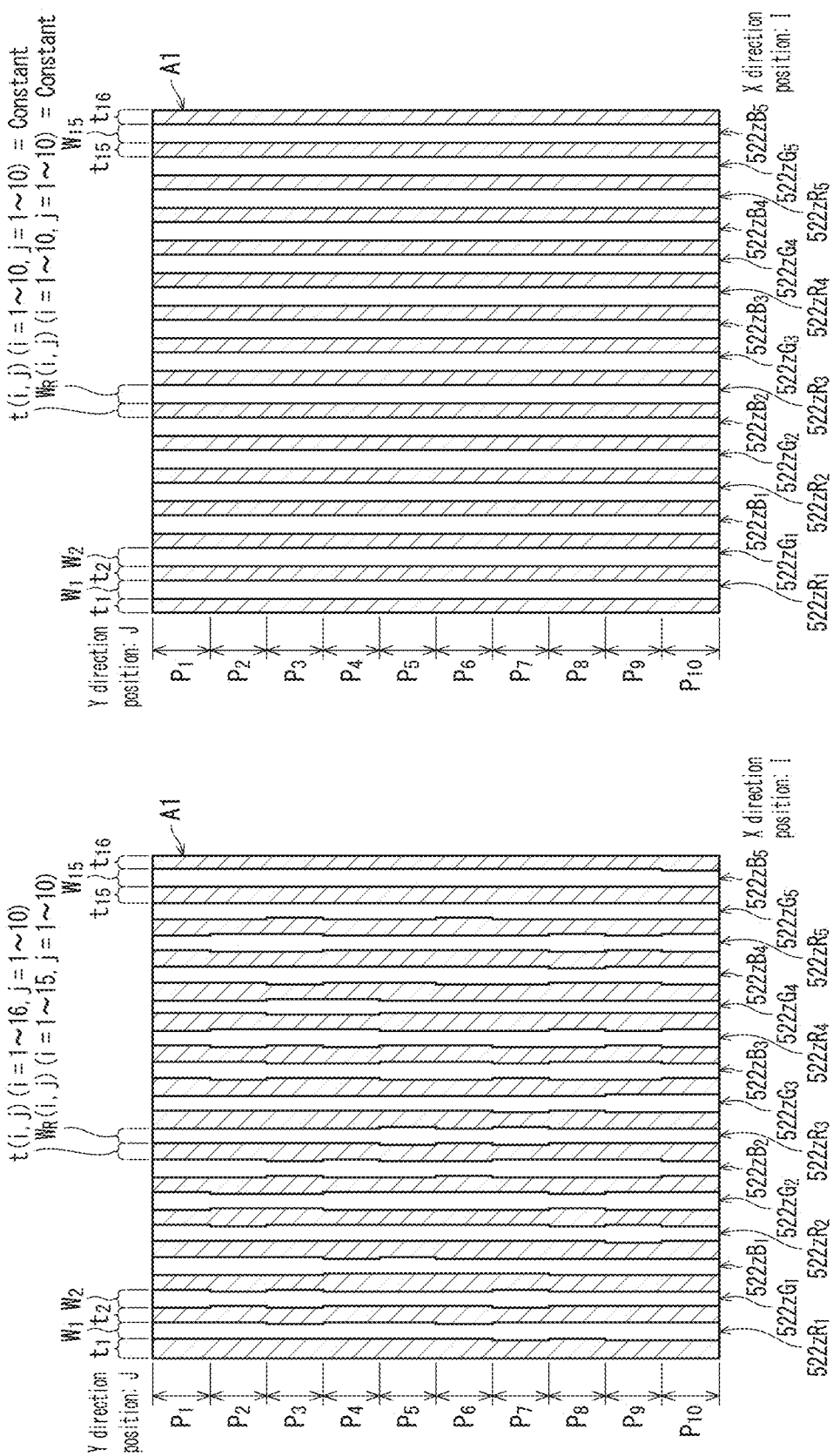

ORGANIC EL DISPLAY PANEL AND METHOD FOR MANUFACTURING ORGANIC EL DISPLAY PANEL

This application claims priority to Japanese Patent Application No. 2017-173541 filed Sep. 8, 2017, the contents of which are hereby incorporated by reference in their entirety.

BACKGROUND

Technical Field

The present disclosure relates to organic electroluminescence (EL) display panels that use electroluminescence of organic materials and methods of manufacturing organic EL display panels.

Background Art

In recent years, organic EL display panels in which organic EL elements are arranged in a matrix on a substrate have been implemented as display panels used in display devices such as digital televisions. In such organic EL display panels, each organic EL element emits its own light and therefore visibility is high.

Typically, in such organic EL display panels, light emitting layers of adjacent organic EL elements are partitioned by an insulating layer made of an insulating material. In an organic EL display panel for a color display, each organic EL element forms a red (R), blue (B), or green (G) pixel and adjacent RGB pixels combine to form unit pixels in a color display. Each organic EL element has a structure in which a functional film such as a light emitting layer including an organic light emitting material is disposed between an electrode pair of an anode and a cathode. When driven, a voltage is applied across the electrode pair, and holes injected to the light emitting layer from the anode and electrons injected to the light emitting layer from the cathode recombine to emit light.

In recent years, as a method for forming efficient functional films as devices are scaled up, wet processes have been proposed in which ink containing a functional material is applied by using an inkjet method or the like. For example, JP 2007-234232 describes that film forming is possible by dropping an organic material solution of uniform concentration between banks in a Y direction and applying a solution amount according to a volume of space between the banks, thereby making it possible to form a uniform organic light emitting layer by a simple and easy process.

SUMMARY

An organic EL display panel pertaining to at least one embodiment of the present disclosure is an organic EL display panel in which a plurality of pixels are arranged in a matrix of rows and columns. The organic EL display panel includes a substrate, pixel electrodes, column insulating layers, organic light emitting layers, and a counter electrode layer. The pixel electrodes are disposed above the substrate and arranged in the matrix. The column insulating layers are disposed above the substrate at least between edges of the pixel electrodes in a row direction, extending in a column direction and arranged side-by-side in the row direction. The organic light emitting layers are each continuous in the column direction and are disposed in gaps between the column insulating layers adjacent to each other in the row direction. The counter electrode layer is disposed above the organic light emitting layers. Width in the row direction of the organic light emitting layers is defined by width of the gaps between the column insulating layers. The width in the row direction of each of the organic light emitting layers changes at intervals in the column direction. For each of the organic light emitting layers, a minimum interval among the intervals is equal to or less than a pitch in the column direction of the pixel electrodes. The changes are different for each of the organic light emitting layers.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 13A, 13B are schematic cross section diagrams taken from the same location as A2-A2 in FIG. 4 illustrating processes in manufacturing of the display panel 10 according to at least one embodiment.

FIG. 14A is a schematic plan view diagram illustrating aspects of at least one embodiment of the display panel 10, and FIG. 14B is a schematic plan view diagram illustrating aspects of a reference example.

DETAILED DESCRIPTION

Circumstances Leading to Embodiments

There is a technical problem according to the technology described in JP 2007-234232, for which there are cases in which minute variation occurs in film thickness of a functional layer in the column direction, which can be recognized as stripes of luminance unevenness depending on viewing angle of a display image.

The present disclosure has been achieved in view of the technical problem described above, and an aim of the present disclosure is to describe an organic EL display panel and a method of manufacturing an organic EL display panel for which streaks of luminance unevenness in the row direction caused by changes in film thicknesses of functional layers in the column direction that are common to multiple functional layers along the row direction do not stand out.

Figure 16A:
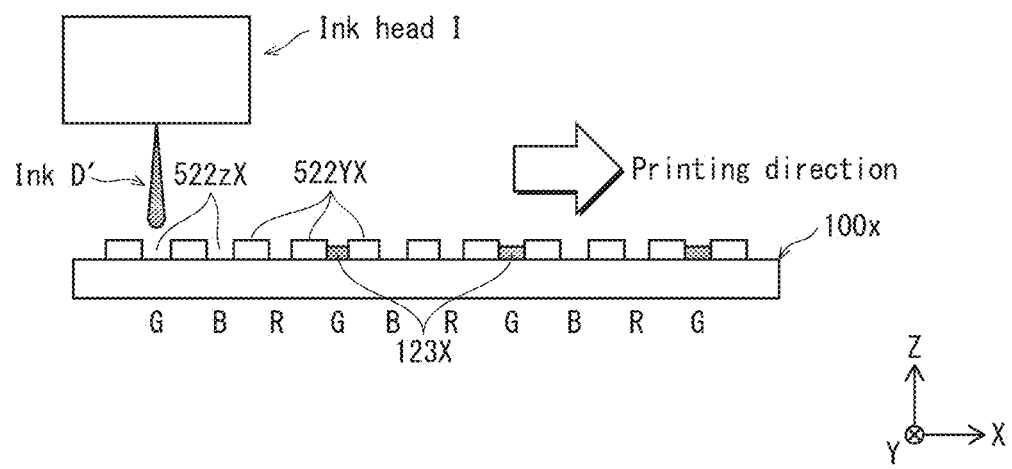
FIG. 16A is a side view diagram illustrating a process according to at least one embodiment of applying ink for light emitting layer formation to gaps 522zX between adjacent column banks 522YX on a substrate.
Figure 16B:
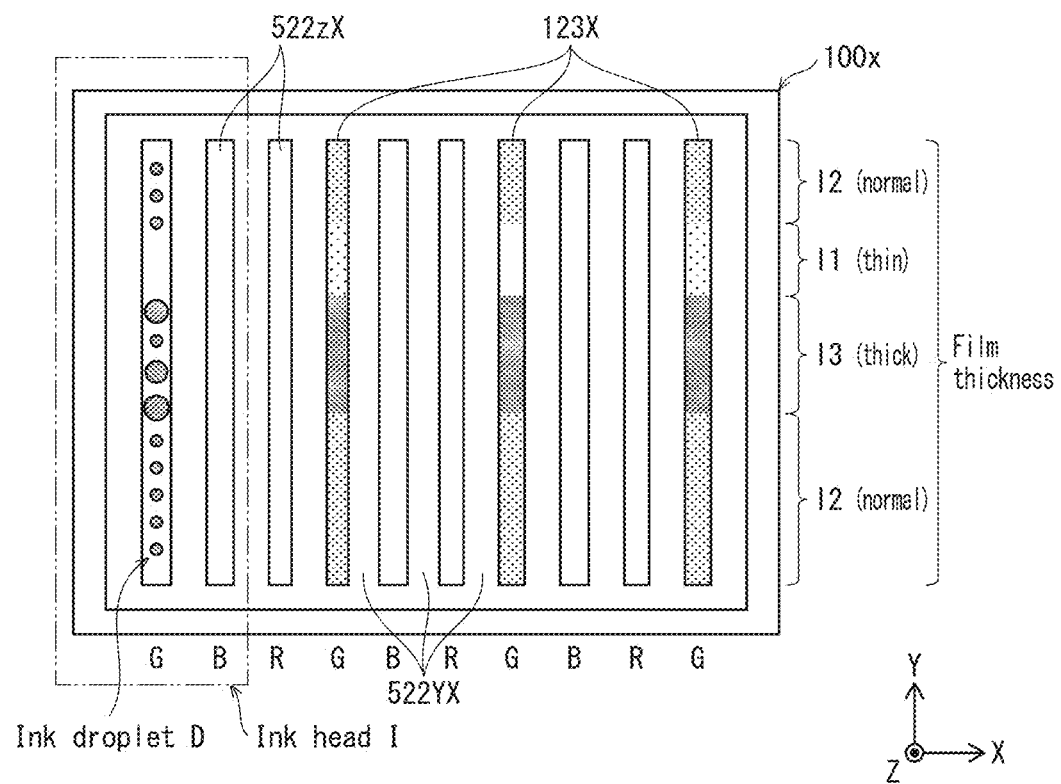
FIG. 16B is a schematic plan view diagram of same.

As a method for forming efficient functional films, wet processes have been proposed in which ink containing a functional material is applied by using an inkjet method or the like. In such wet processes, positional accuracy when separating functional films does not depend on substrate size, and therefore a merit of wet processes is that the technical barrier to scaling up devices is relatively low. FIG. 16A is a side view diagram illustrating a process according to at least one embodiment of applying ink for light emitting layer formation to gaps 522zX between adjacent column banks 522YX on a substrate and FIG. 16B is a schematic plan view diagram of same. In the process, as illustrated in FIG. 16A, an ink head I is moved in one direction relative to the surface of the substrate, while ink D' is dropped from nozzles of the ink head I onto defined regions of the surface of the substrate. Solvent of the ink is then evaporated by drying to form a functional layer 123X. At such time, as illustrated in FIG. 16B, in the process of dropping and applying ink onto the substrate, thicknesses 11, 12, 13 of the functional layer 123X tend to vary in a direction parallel to the nozzle column due to factors such as variation in ink droplet D sizes ejected from the nozzles.

To counter this tendency, JP 2007-234232 describes that film forming is possible by dropping an organic material solution of uniform concentration between banks in a Y direction, applying a solution amount according to a volume of space between the banks, thereby making it possible to form a uniform organic light emitting layer by a simple and easy process. That is, by providing a column-shape application region in a gap between line-shape banks that allows applied ink to flow between pixels in a direction parallel to the nozzle column, applied ink is levelled in the direction parallel to the nozzle column to reduce variation in film thickness of functional layers, and occurrence of streaks of luminance unevenness in an organic EL display panel can be reduced.

However, according to studies by the inventors, even when an inkjet device is provided with column-shape application regions parallel to a nozzle column in order to level applied ink, small variations in functional layer film thickness may remain. For example, it has been found that when a display screen is viewed from a low viewing angle, it is possible to recognize streaks of luminance unevenness.

Figure 17A:
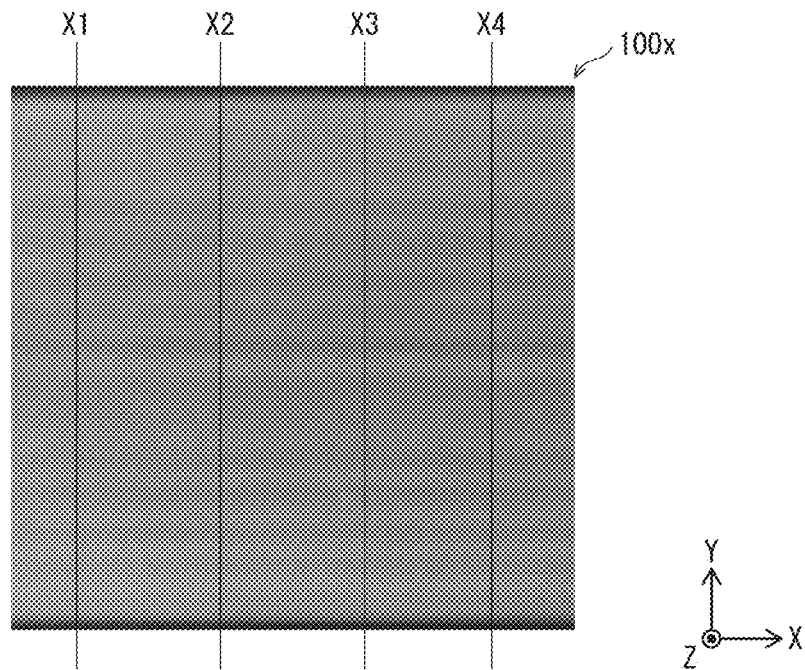
FIG. 17A is a photograph illustrating a display image of a conventional organic EL display panel from a low viewing angle.
Figure 17B:
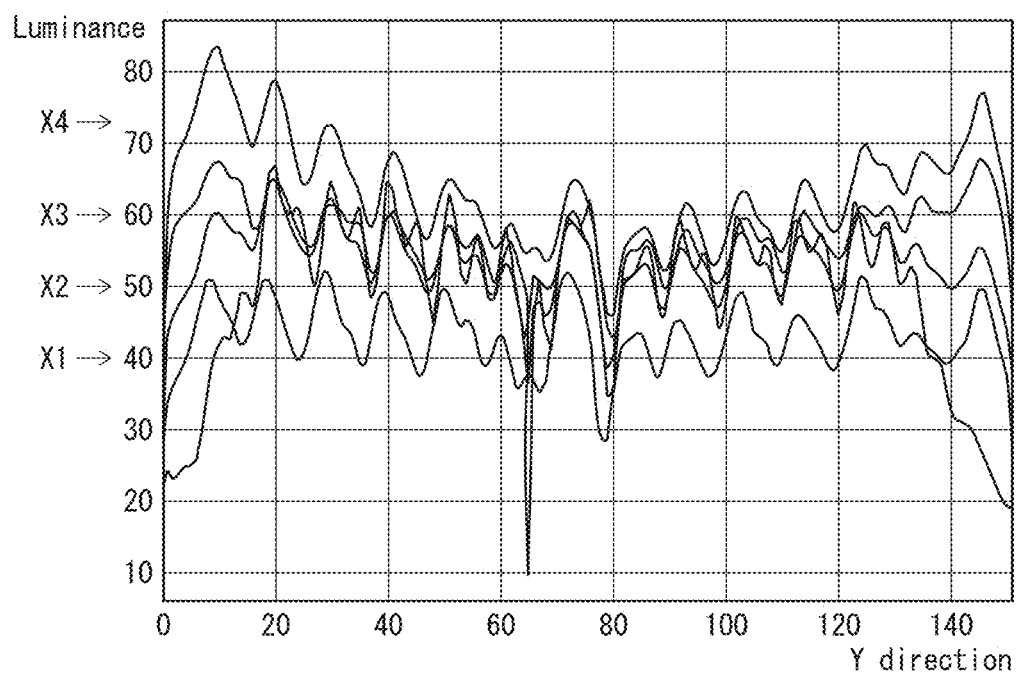
FIG. 17B is a graph of measurement results illustrating luminance distribution taken along X1-X1, X2-X2, X3-X3, and X4-X4 from FIG. 17A.

FIG. 17A is a photograph illustrating a display image of a conventional organic EL display panel from a low viewing angle. As described above, when film thicknesses of the functional layers 123 are different, light emitting properties of each of the functional layers differ, and this is a cause of streaks of luminance unevenness in an organic EL display panel, the streaks having a pitch of approximately 10.7 sub-pixels parallel to a nozzle scanning direction. FIG. 17B is a graph of measurement results illustrating luminance distribution for a region corresponding to 150 sub-pixels in Y direction cross-sections taken along X1-X1, X2-X2, X3-X3, X4-X4 in FIG. 17A. According to FIG. 17B, it can be seen that the luminance distributions along cross-sections X1-X1 to X4-X4 at different positions in the scanning direction of ink head I have similar distribution shapes in a column direction that are recognized as streaks of luminance unevenness in a row direction. In a top-emission type of organic EL element, a surface portion of a pixel electrode is made using a material having high light reflectivity, and by optimally setting thicknesses that define an optical path in order to implement an optical resonator structure, the color of emitted light can be adjusted and luminance can be increased. However, under the condition of viewing a display image from a low viewing angle direction, the influence of optical path differences caused by small film thickness variations is larger than when viewing from a high viewing angle, and luminance unevenness is more conspicuous than when the display image is viewed from the high viewing angle.

In view of the technical problem described above, for a panel structure in which functional layers are arranged in a matrix, the inventors investigated a configuration that makes streaks of luminance unevenness in a row direction caused by changes in film thicknesses of functional layers in a column direction less conspicuous, and arrived at the embodiments described below.

<<Overview of Embodiments of Present Disclosure>>

An organic EL display panel pertaining to at least one embodiment of the present disclosure is an organic EL display panel in which a plurality of pixels are arranged in a matrix of rows and columns. The organic EL display panel includes a substrate, pixel electrodes, column insulating layers, organic light emitting layers, and a counter electrode layer. The pixel electrodes are disposed above the substrate and arranged in the matrix. The column insulating layers are disposed above the substrate at least between edges of the pixel electrodes in a row direction, extending in a column direction and arranged side-by-side in the row direction. The organic light emitting layers are each continuous in the column direction and are disposed in gaps between the column insulating layers adjacent to each other in the row direction. The counter electrode layer is disposed above the organic light emitting layers. Width in the row direction of the organic light emitting layers is defined by width of the gaps between the column insulating layers. The width in the row direction of each of the organic light emitting layers changes at intervals in the column direction. For each of the organic light emitting layers, a minimum interval among the intervals is equal to or less than a pitch in the column direction of the pixel electrodes. The changes are different for each of the organic light emitting layers.

According to this configuration of a panel structure, by superimposing modulated luminance distribution that varies differently from row direction streaks of luminance unevenness with the row direction streaks of luminance unevenness caused by variation in functional layer film thickness in the column direction that is common across layers in the row direction, the row direction streaks of luminance unevenness are made to stand out less.

According to at least one embodiment, width in the row direction of each of the column insulating layers irregularly and/or aperiodically changes at intervals in the column direction, for each of the column insulating layers, a minimum interval among the intervals is equal to or less than the pitch in the column direction of the pixel electrodes, and the changes are different for each of the column insulating layers.

According to this configuration, width in the row direction of the organic light emitting layers, which is defined by width of the gaps between the column insulating layers, can be made to change in the column direction at minimum intervals equal to or less than the pitch in the column direction of the pixel electrodes, and to change differently for each of the organic light emitting layers.

According to at least one embodiment, the minimum interval is ⅙ or less of the pitch of the pixel electrodes in the column direction.

According to this configuration, by superimposing modulated luminance distribution that varies differently from row direction streaks of luminance unevenness with the row direction streaks of luminance unevenness caused by variation in functional layer film thickness in the column direction that is common across layers in the row direction, where the luminance unevenness occurs in the column direction parallel to a nozzle column due to variation in ink droplet D size ejected from an inkjet head, the row direction streaks of luminance unevenness are made to stand out less.

According to at least one embodiment, the shorter a wavelength of light emitted by a given one of the organic light emitting layers, the greater a range of variation of the width in the row direction of the organic light emitting layer.

According to this configuration, it is possible to superimpose a larger luminance change with respect to a light emitting layer having a shorter wavelength of light, i.e., a light emitting layer for which variation in film thickness has a greater influence on optical path differences and therefore luminance unevenness is more easily recognized, and therefore luminance unevenness can be effectively made to stand out less for light emitting layers that emit different colors of light.

According to at least one embodiment, an absolute value of a cross-correlation coefficient between two sequences is 0.2 or less, where each of the sequences consists of widths in the row direction of one of the organic light emitting layers at positions in the column direction between a pair of the column insulating layers selected from the column insulating layers.

According to this configuration, change in the width in the row direction of the organic light emitting layers in the column direction is different for each of the organic light emitting layers, and therefore recognition of streaks of luminance unevenness in the row direction is suppressed.

According to at least one embodiment, three of the column insulating layers that are adjacent in the row direction are selected from the column insulating layers and referred to as a first column insulating layer, a second column insulating layer, and a third column insulating layer, and an absolute value of a cross-correlation coefficient between a sequence consisting of widths in the row direction of one of the organic light emitting layers at positions in the column direction between the first column insulating layer and the second column insulating layer and a sequence consisting of widths in the row direction of one of the organic light emitting layers at positions in the column direction between the second column insulating layer and the third column insulating layer is referred to as an adjacent correlation value, and an average of adjacent correlation values calculated from the selections of three column insulating layers from the column insulating layers is 0.2 or less.

According to this configuration, change in the width in the row direction of the organic light emitting layers in the column direction further suppresses recognition of streaks of luminance unevenness in the row direction.

An organic EL display panel according to at least one embodiment of the present disclosure is an organic EL display panel in which a plurality of pixels are arranged in a matrix of rows and columns. The organic EL display panel includes a substrate, pixel electrodes, column insulating layers, organic light emitting layers, and a counter electrode layer. The pixel electrodes are disposed above the substrate and arranged in the matrix. The column insulating layers are disposed above the substrate at least between edges of the pixel electrodes in a row direction, extending in a column direction and arranged side-by-side in the row direction. The organic light emitting layers are each continuous in the column direction and are disposed in gaps between the column insulating layers adjacent to each other in the row direction. The counter electrode layer is disposed above the organic light emitting layers. In a rectangular region above the substrate in which at least a defined number of the pixels are arranged in the matrix in the row and column directions: width in the row direction of the organic light emitting layers is defined by width of the gaps between the column insulating layers; the width in the row direction of each of the organic light emitting layers changes at intervals in the column direction; for each of the organic light emitting layers, a minimum interval among the intervals is equal to or less than a pitch in the column direction of the pixel electrodes; and the changes are different for each of the organic light emitting layers. The rectangular region is repeated in the column direction.

According to this configuration, when random numbers are generated to define widths of the organic light emitting layers 123 in the row direction, a range defining widths can be limited to a rectangular region, and therefore design of a substrate can be simplified.

According to at least one embodiment, the rectangular region includes at least five pixels in the row direction and at least ten pixels in the column direction.

According to this configuration, even when the rectangular region is repeated multiple times in the row and column directions, it is made difficult to recognize as periodically repeated unevenness.

A method of manufacturing an organic EL display panel according to at least one embodiment is a method of manufacturing an organic EL display panel in which a plurality of pixels are arranged in a matrix of rows and columns, the method including: preparing a substrate; forming pixel electrodes above the substrate arranged in the matrix; forming column insulating layers above the substrate at least between edges of the pixel electrodes in a row direction, extending in a column direction and arranged side-by-side in the row direction; forming organic light emitting layers that are each continuous in the column direction by applying an ink including an organic light emitting material into gaps between the column insulating layers; and forming a counter electrode layer above the organic light emitting layers. The column insulating layers are formed to each have a width in the row direction that irregularly and/or aperiodically changes at intervals in the column direction. For each of the column insulating layers, a minimum interval among the intervals is made equal to or less than a pitch in the column direction of the pixel electrodes. The changes are different for each of the column insulating layers.

According to this configuration, when an EL display panel is manufactured that has a panel structure having columns of functional layers, row direction streaks of luminance unevenness caused by variance in thickness of the functional layers along the column direction that is common across functional layers in the row direction is made to stand out less.

According to at least one embodiment, the organic light emitting layers are formed to each have a width in the row direction that changes at intervals in the column direction, for each of the organic light emitting layers, a minimum interval among the intervals is equal to or less than the pitch in the column direction of the pixel electrodes, and the changes are different for each of the organic light emitting layers.

According to this configuration, an organic EL display panel can be structured such that width in the row direction of the organic light emitting layers, which is defined by width of the gaps between the column insulating layers, can be made to change in the column direction at minimum intervals equal to or less than the pitch in the column direction of the pixel electrodes, and to change differently for each of the organic light emitting layers.

A display panel pertaining to at least one embodiment of the present disclosure is described below with reference to the drawings.

Embodiment 1

1. Configuration 1.1. Circuit Configuration of Display Device 1

The following is a description of a circuit configuration of an organic electroluminescence (EL) display device 1 pertaining to Embodiment 1 (hereinafter also referred to as "display device 1") provided with reference to FIG. 1.

Figure 1:
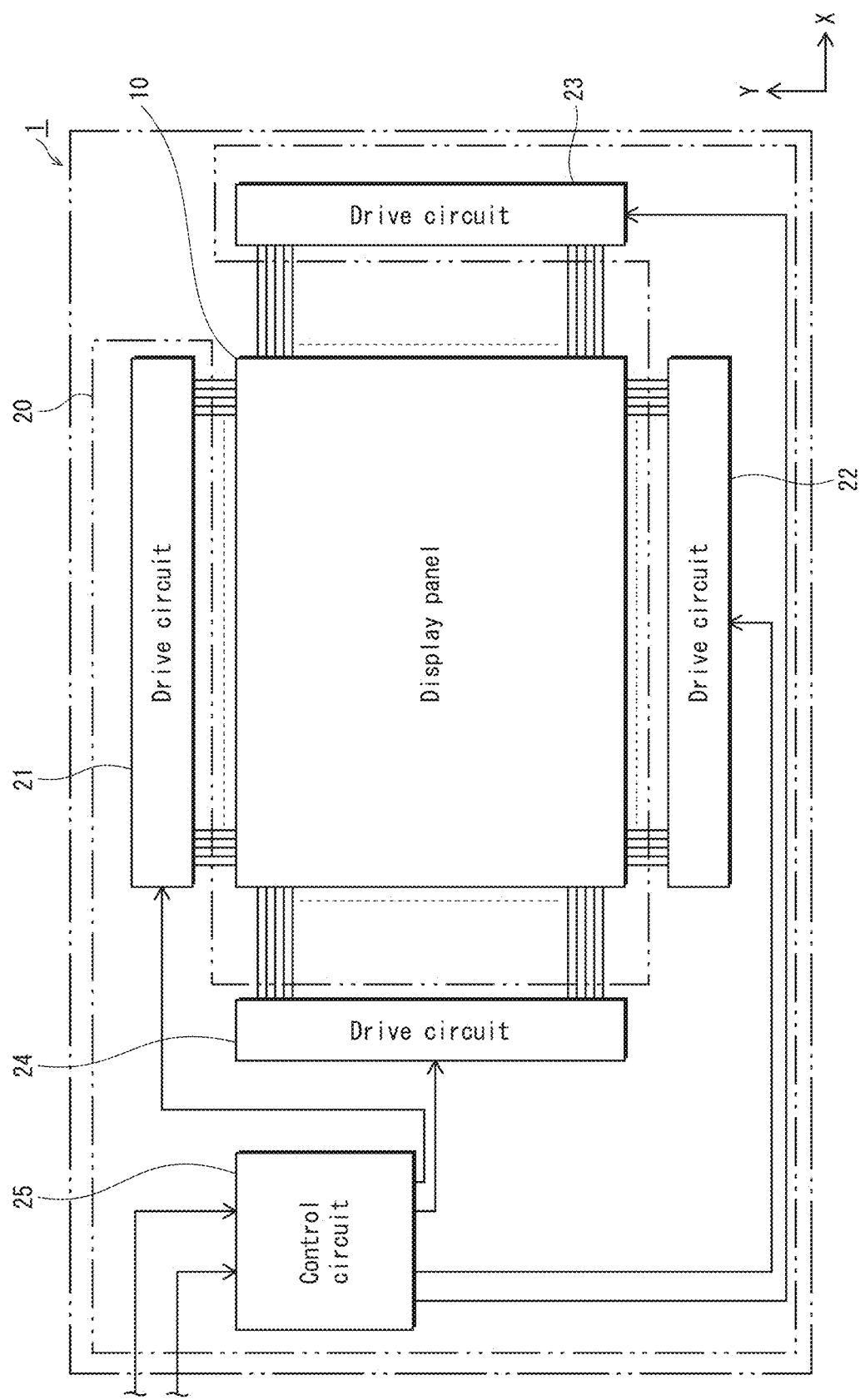
FIG. 1 is a schematic block diagram illustrating circuit configuration of an organic EL display device 1 according to at least one embodiment.

As illustrated in FIG. 1, the display device 1 includes an organic EL display panel 10 (hereinafter also referred to as "display panel 10") and drive control circuitry 20 connected to the display panel 10.

The display panel 10 is an organic EL panel that makes use of electroluminescence of an organic material, in which organic EL elements are, for example, arranged in a matrix. The drive control circuitry 20 includes four drive circuits 21, 22, 23, 24 and a control circuit 25.

1.2. Circuit Configuration of Display Panel 10

In the display panel 10, unit pixels 100e are arranged in a matrix, forming a display region. Each of the unit pixels 100e includes three organic EL elements, i.e., three sub-pixels 100se emitting red (R), green (G), and blue (B) light respectively. Circuit configuration of each of the sub-pixels 100se is described with reference to FIG. 2.

Figure 2:
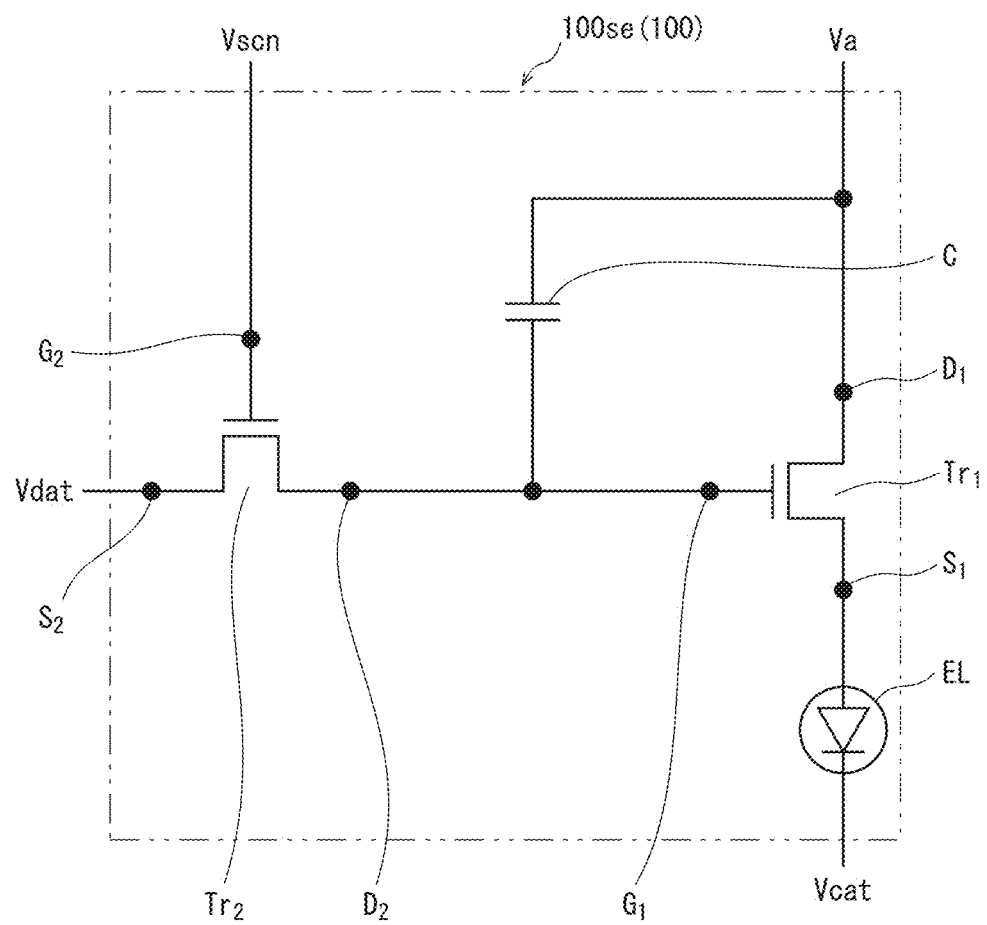
FIG. 2 is a schematic circuit diagram illustrating circuit configuration of a sub-pixel 100se of a display panel 10 used in the organic EL display device 1 according to at least one embodiment.

FIG. 2 is a schematic circuit diagram illustrating circuit configuration in an organic EL element 100 corresponding to each of the sub-pixels 100se of the display panel 10 used in the display device 1 according to at least one embodiment.

As illustrated in FIG. 2, in the display panel 10 pertaining to the present embodiment, each of the sub-pixels 100se includes two transistors Tr1, Tr2, one capacitor C, and an organic EL element portion EL as a light emitter. The transistor Tr1 is a drive transistor and the transistor Tr2 is a switching transistor.

A gate G2 of the switching transistor Tr2 is connected to a scan line Vscn, and a source S2 is connected to a data line Vdat. A drain D2 of the switching transistor Tr2 is connected to a gate G1 of the drive transistor Tr1.

A drain D1 of the drive transistor Tr1 is connected to a power source line Va, and a source S1 is connected to a pixel electrode (anode) of the organic EL element portion EL. A common electrode layer (cathode) of the organic EL element portion EL is connected to a ground line Vcat.

A first end of the capacitor C is connected to the drain D2 of the switching transistor Tr2 and the gate G1 of the drive transistor Tr1, and a second end of the capacitor C is connected to the power source line Va.

In the display panel 10, a plurality of adjacent sub-pixels 100se (for example, three sub-pixels 100se that emit red (R), green (G), and blue (B) light) constitute a single unit pixel 100e, and the unit pixels 100e are distributed and arranged to constitute a pixel region. For each of the sub-pixels 100se, a gate line leads out from the gate G2 and is connected to a scan line Vscn connected from outside the display panel 10. Similarly, for each of the sub-pixels 100se, a source line leads out from the source S2 and is connected to a data line Vdat connected from outside the display panel 10.

Further, power source lines Va and ground lines Vcat of sub-pixels 100se are aggregated and connected to a power source line and a ground line of the display device 1.

1.3. Overall Configuration of Display Panel 10

The display panel 10 pertaining to the present embodiment is described with reference to the drawings. Note that the drawings are schematic diagrams and are not necessarily to scale.

1.3.1. Overview of Display Panel 10

Figure 3:
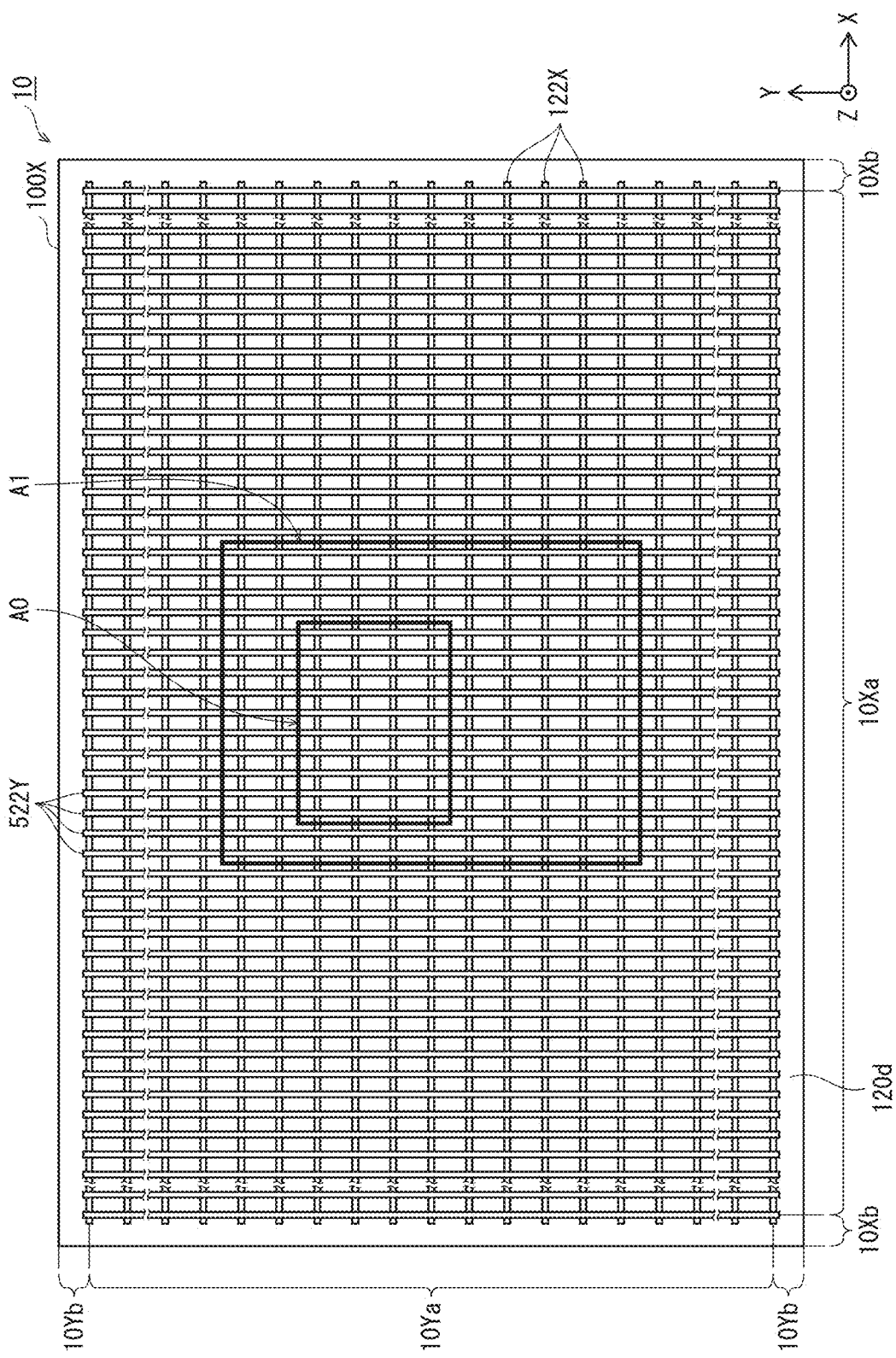
FIG. 3 is a schematic plan view diagram of the display panel 10 according to at least one embodiment.

FIG. 3 is a schematic plan view diagram of the display panel 10 according to at least one embodiment. The display panel 10 is an organic EL display panel that makes use of electroluminescence of an organic compound. The display panel 10 has a top-emission configuration in which light is emitted from a top surface thereof, and in which organic EL elements 100, which constitute pixels, are arranged in a matrix on a substrate 100x (TFT substrate) including thin film transistors (TFTs). Here, in the present description, the X direction, Y direction, and Z direction in FIG. 3 represent a row direction, column direction, and thickness direction of the display panel 10, respectively.

As illustrated in FIG. 3, the display panel 10 includes a partitioned region 10a (also referred to as a partitioned region 10Xa, 10Ya in terms of the X, Y directions) in which column banks 522Y (column insulating layers) and row banks 122 (row insulating layers) are arranged, defining light emission units of RGB colors in a matrix on the substrate 100x and a non-partitioned region 10b (also referred to as a non-partitioned region 10Xb, 10Yb in terms of the X, Y directions) surrounding the partitioned region 10a. An outer peripheral edge in the column direction of the partitioned region 10a corresponds to ends in the column direction of the column banks 522Y. In the non-partitioned region 10b, a rectangular sealing member (not illustrated) surrounds the partitioned region 10a.

1.3.2. Overview of Organic EL Elements 100

Figure 4:
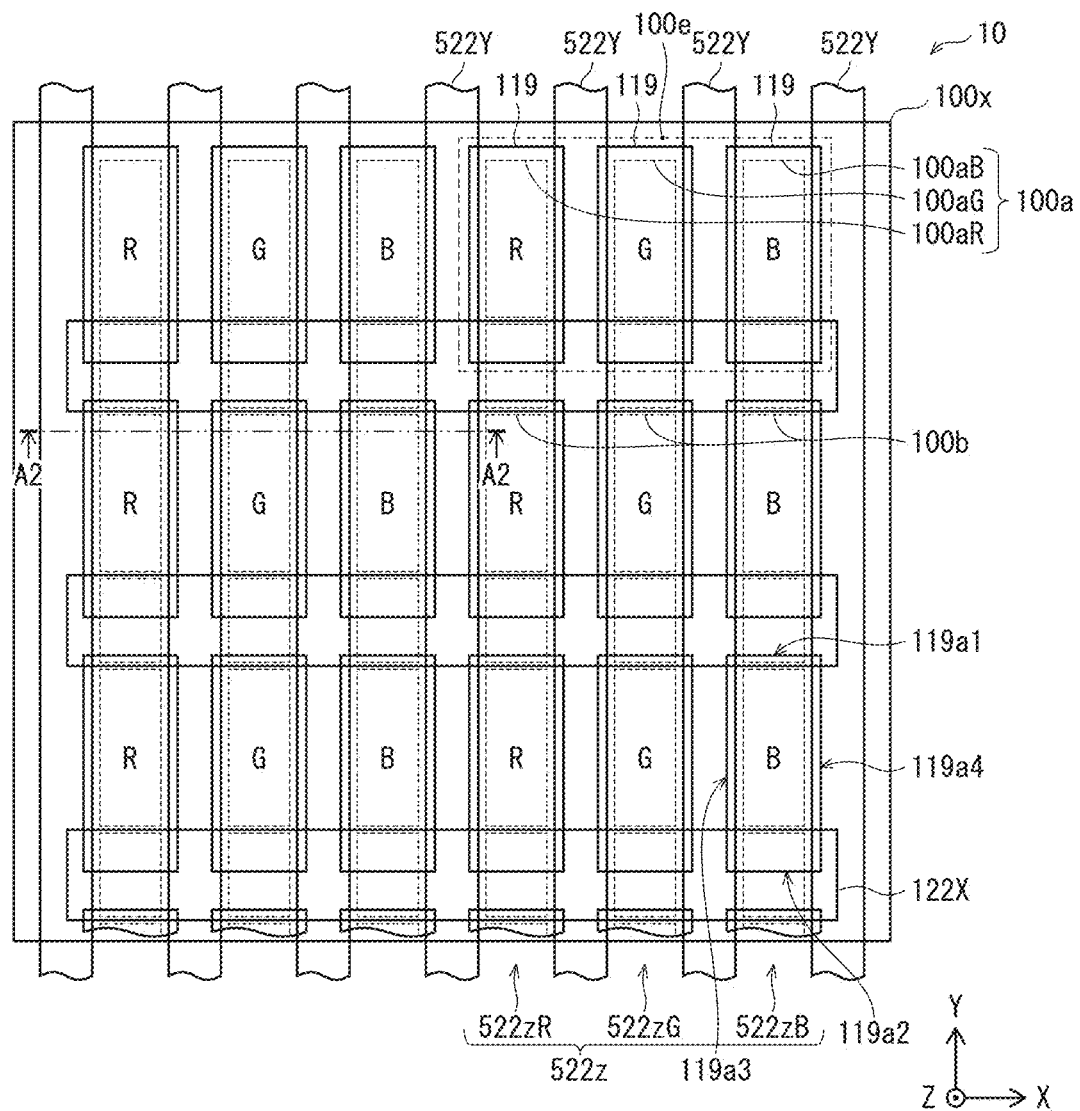
FIG. 4 is an enlarged plan view diagram of a portion A0 from FIG. 3 according to at least one embodiment.

FIG. 4 is an enlarged plan view diagram of a portion A0 from FIG. 3 according to at least one embodiment.

In the partitioned region 10a of the display panel 10, the unit pixels 100e, which are formed from organic EL elements 100, are arranged in a matrix. In each of the unit pixels 100e are a red-self-light-emission region 100aR, a green-self-light-emission region 100aG, and a blue-self-light-emission region 100aB (also referred to as self-light-emission regions 100a), the three self-light-emission regions 100a being regions that emit light due to an organic compound. In other words, three sub-pixels 100se corresponding to self-light-emission regions 100aR, 100aG, 100aB lined up in the row direction constitute one set or one of the unit pixels 100e in a color display.

In the display panel 10, pixel electrodes 119 are arranged in a matrix on the substrate 100x, separated from each other by a defined distances in the row and column directions. The pixel electrodes 119 are, for example, substantially rectangular in plan view, and are made of a light-reflective material. Three pixel electrodes 119 lined up in the row direction correspond to three self-light-emission regions 100aR, 100aG, 100aB lined up in the row direction.

Pixel electrodes 119 that are adjacent to each other are insulated from each other. Between adjacent pixel electrodes 119 are insulating layers that extend in a line shape.

The column banks 522Y extend in the column direction (Y direction in FIG. 3) and are arranged in a plurality of columns. Each of the column banks 522Y is above a region on the substrate 100x between pixel electrodes 119 adjacent to each other in the row direction (between an edge 119a3 in the row direction of one pixel electrode 119 and an edge 119a4 in the row direction of a pixel electrode 119 adjacent to the one pixel electrode 119). Thus, row direction edges of the self-light-emission regions 100a are defined by row direction edges of the column banks 522Y.

The row banks 122X extend in the row direction (X direction in FIG. 3) and are arranged in a plurality of rows. Each of the row banks 122X is above a region on the substrate 100x between pixel electrodes 119 adjacent to each other in the column direction (between an edge 119a1 in the column direction of one pixel electrode 119 and an edge 119a2 in the column direction of a pixel electrode 119 adjacent to the one pixel electrode 119). Regions in which the row banks 122X are present are non-self-light-emission regions 100b in which organic electroluminescence does not occur in the light emitting layers 123 above the pixel electrodes 119. Thus, column direction edges of the self-light-emission regions 100a are defined by column direction edges of the row banks 122X.

When gaps 522z are defined between column banks 522Y that are adjacent to each other, the gaps 522z include red gaps 522zR corresponding to the non-self-light-emission regions 100aR, green gaps 522zG corresponding to non-self-light-emission regions 100aG, and blue gaps 522zB corresponding to non-self-light-emission regions 100aB (red gaps 522zR, green gaps 522zG, and blue gaps 522zB are also referred to as "gaps 522z"). A large number of the column banks 522Y and the gaps 522z are arranged alternating across the display panel 10.

In the display panel 10, a plurality of self-light-emission regions 100a and non-self-light-emission regions 100b are arranged alternating in the column direction along the red gaps 522zR, the green gaps 522zG, and the blue gaps 522zB. In the non-self-light-emission regions 100b are connecting recesses (contact holes, not illustrated) that connect with the pixel electrodes 119 and the TFT sources S1, and with respect to the pixel electrodes 119, contact regions (contact windows, not illustrated) are provided on the pixel electrodes 119 for electrical connection.

In one sub-pixel 100se, the column banks 522Y provided in the column direction and the row banks 122X provided in the row direction are orthogonal, and the self-light-emission region 100a is located between row banks 122X that are adjacent to each other in the column direction.

1.4. Components of Display Panel 10

Figure 5:
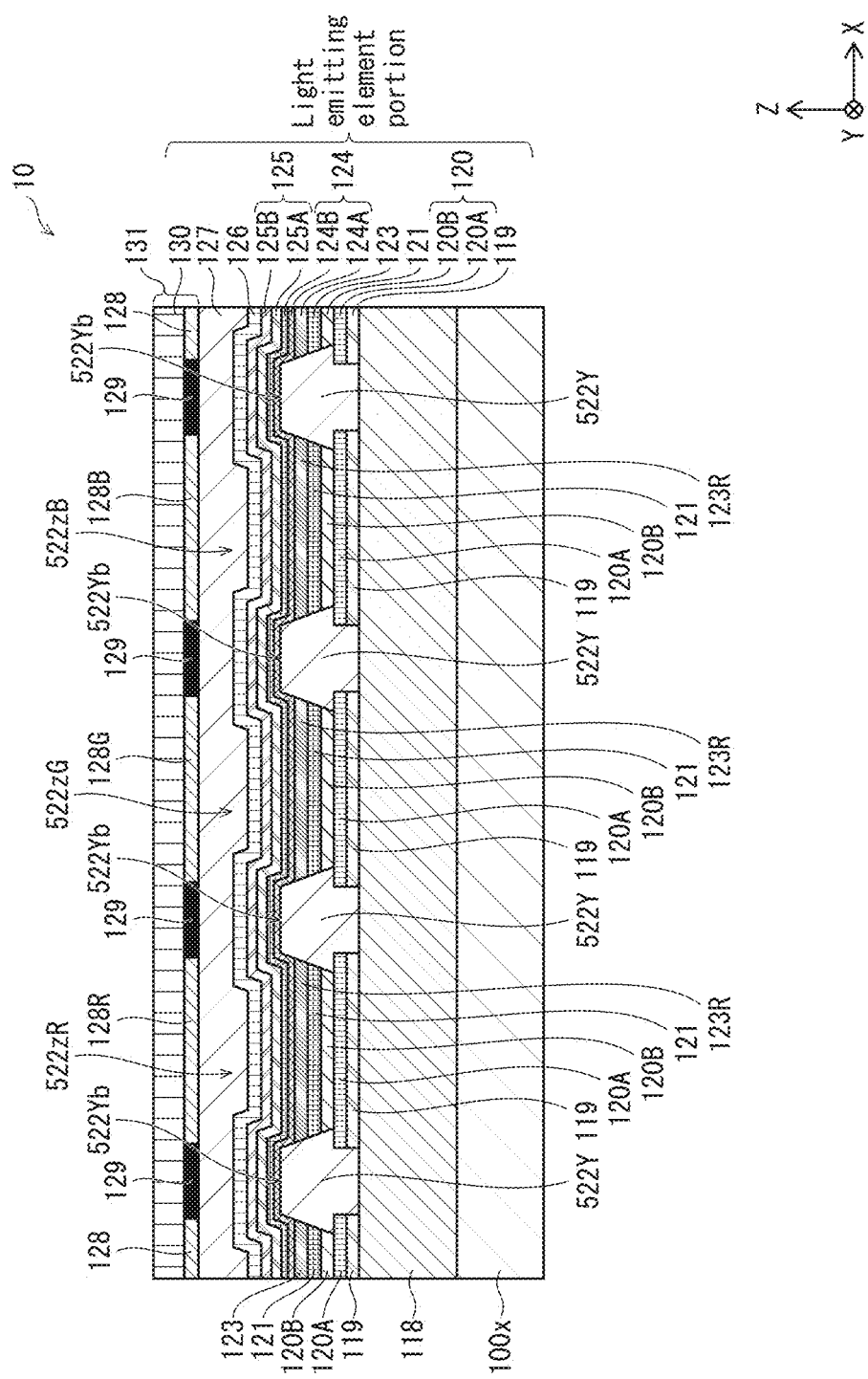
FIG. 5 is a schematic cross section diagram taken along A2-A2 from FIG. 4 according to at least one embodiment.

Configuration of the organic EL elements 100 in the display panel 10 is described with reference to FIG. 5. FIG. 5 is a schematic cross section diagram taken along A2-A2 from FIG. 4 according to at least one embodiment.

In the display panel 10 according to the present embodiment, a substrate (TFT substrate) including thin film transistors is lowest in the Z axis direction, above which are organic EL element portions.

1.4.1. Components of Organic EL Elements 100

(1) Substrate 100x

The substrate 100x is a support member of the display panel 10 and includes a base (not illustrated) and a thin film transistor layer (not illustrated) on the base.

The base is a support member of the display panel 10, and is a flat plate. As a material of the base, an electrically insulating material such as a glass material, a resin material, a semiconductor material, or a metal material coated with an insulating layer can be used.

The TFT layer includes TFTs and wiring (connecting sources S1 of the TFTs to corresponding pixel electrodes 119) formed on a top surface of the base. TFTs electrically connect corresponding pixel electrodes 119 to an external power source in response to a drive signal from an external circuit of the display panel 10, and have multilayer structures including an electrode, a semiconductor layer, an insulating layer, and the like. Wiring electrically connects the TFTs, the pixel electrodes 119, external power source, external circuit, and the like.

(2) Planarizing Layer 118

A planarizing layer 118 is provided on a top surface of the base and TFT layer. The planarizing layer 118 on a top surface of the substrate 100x planarizes the top surface of the substrate 100x, which is irregular due to the TFT layer. Further, the planarizing layer 118 fills between wiring and TFTs, electrically insulating between the wiring and TFTs.

In order to connect the pixel electrodes 119 to wiring connected to the sources S1 of corresponding pixels, the planarizing layer 118 is provided with contact holes (not illustrated) above the wiring.

1.4.2. Organic EL Element Portion (1) Pixel Electrodes 119

As FIG. 4 illustrates, the pixel electrodes 119 are formed in units of the sub-pixels 100se on the planarizing layer 118 disposed on the upper surface of the substrate 100x.

The pixel electrodes 119 supply carriers to the light emitting layers 123. For example, if functioning as anodes, the pixel electrodes 119 supply holes to the light emitting layers 123. Further, the display panel 10 is a top-emission type, and therefore the pixel electrodes 119 are light reflective. The pixel electrodes 119 have, for example, a flat substantially rectangular plate shape in plan view. In contact holes (not illustrated) of the planarizing layer 118 are formed connecting recesses (contact holes, not illustrated) of the pixel electrodes 119 that are portions of the pixel electrodes 119 recessed towards the substrate 100x, and at bottoms of the connecting recesses the pixel electrodes 119 are connected to wiring connected to sources S1 of corresponding pixels.

(2) Hole Injection Layers 120

As illustrated in FIG. 5, hole injection layers 120 are layered on the pixel electrodes 119. The hole injection layers 120 have a function of transporting holes injected from the pixel electrode layers 119 to hole transport layers 121.

Each of the hole injection layers 120 includes, in order from a side nearest the substrate 100x, a hole injection layer 120A made of a metal oxide formed on a corresponding one of the pixel electrodes 119 and a hole injection layer 120B made of an organic material layered on the hole injection layer 120A in the gaps 522zR, 522zG, 522zB.

According to the present embodiment, the hole injection layers 120B each have a linear shape and extend in the column direction in the gaps 522zR, 522zG and 522zB. However, the hole injection layers 120B may be discontinuous in the column direction in the gaps 522z, i.e., provided only on the hole injection layers 120A on the pixel electrodes 119.

(3) Banks 122

As illustrated in FIG. 5, banks made of an insulating material are formed so as to cover edges of the pixel electrodes 119 and the hole injection layers 120. The banks include the column banks 522Y that extend in the column direction and are arranged side-by-side in the row direction and the row banks 122X that extend in the row direction and are arranged side-by-side in the column direction. As illustrated in FIG. 3, the column banks 522Y extend in the column direction that is orthogonal to the row banks 122X, the column banks 522Y and the row banks 122X forming a lattice shape (the row banks 122X and the column banks 522Y are also referred to as "banks 122").

The row banks 122X each have a line shape extending in the row direction, and in a cross-section taken parallel to the column direction the row banks 122X each have a tapered trapezoid shape that tapers upwards. The row banks 122X pass through the column banks 522Y and extend along the row direction, which is orthogonal to the column direction. The row banks 122X have a top surface that is lower than a top surface 522Yb of the column banks 522Y. Thus, the row banks 122X and the column banks 522Y form openings corresponding to the self-light-emission regions 100a.

The row banks 122X are for controlling flow in the column direction of ink containing an organic compound that is a material of the light emitting layers 123. Thus, the row banks 122X have lyophilicity with respect to the ink of at least a defined value. Accordingly, the row banks 122X suppress variation in ink amount between sub-pixels. The pixel electrodes 119 are not exposed where the row banks 122X are present and regions where the row banks 122X are present do not emit light or contribute to luminance.

The row banks 122X are present above edges in the column direction of the pixel electrodes 119, and thereby help prevent electrical leaks between the pixel electrodes 119 and a common electrode layer 125. Base portions in the column direction of the row banks 122X define edges of the self-light-emission regions 100a of the sub-pixels 100se in the column direction.

The column banks 522Y each have a line shape extending in the column direction, and in a cross-section taken parallel to the row direction the column banks 522Y each have a tapered trapezoid shape that tapers upwards. The column banks 522Y block flow of ink in the row direction, the ink including an organic compound that is a material of the light emitting layers 123. Thus, the column banks 522Y define the row direction edges of the light emitting layers 123.

The column banks 522Y are present above edges in the row direction of the pixel electrodes 119, and thereby help prevent electrical leaks between the pixel electrodes 119 and the common electrode layer 125. Base portions in the row direction of the column banks 522Y define edges of the self-light-emission regions 100a of the sub-pixels 100se in the row direction.

In plan view, width of each of the column banks 522Y irregularly and/or aperiodically changes in the column direction at minimum intervals equal to or less than a pitch in the column direction of the pixel electrodes 119. These changes are different for each of the column banks 522Y. Further details of the column banks 522Y are provided later.

The column banks 522Y have liquid repellency with respect to the ink of at least a defined value.

(4) Hole Transport Layers 121

As illustrated in FIG. 5, the hole transport layers 121 are layered on the hole injection layers 120 in the gaps 522zR, 522zG, 522zB. Further, the hole transport layers 121 are also layered on the hole injection layers 120 on the row banks 122X (not illustrated). The hole transport layers 121 are in contact with the hole injection layers 120B. The hole transport layers 121 have a function of transporting holes injected from the hole injection layers 120 to the light emitting layers 123.

According to the present embodiment, a configuration is adopted in which the hole transport layers 121 each have a line shape extending in the column direction in the gaps 522z, in a similar manner to the hole injection layers 120B.

(5) Light Emitting Layers 123

As illustrated in FIG. 5, the light emitting layers 123 are layered on the hole transport layers 121. The light emitting layers 123 are layers made of an organic compound, and have a function of emitting light through recombination of holes and electrons that occurs in the light emitting layers 123. In the gaps 522zR, 522zG and 522zB defined by the column banks 522Y, the light emitting layers 123 each have a linear shape extending in the column direction. In the red gaps 522zR corresponding to the self-light-emission regions 100aR in the red sub-pixels 100seR, the green gaps 522G corresponding to the self-light-emission regions 100aG in the green sub-pixels 100seG, and the blue gaps 522zB corresponding to the self-light-emission regions 100aB in the blue sub-pixels 100seB are light emitting layers 123R, 123G, 123B, respectively, that emit light of corresponding colors (also collectively referred to as the light emitting layers 123).

Only portions of the light emitting layers 123 that are supplied carriers from the pixel electrodes 119 emit light, and therefore in regions in which the row banks 122X, which are insulators, are present between layers, organic compound electroluminescence does not occur. Thus, only portions of the light emitting layers 123 where the row banks 122X are not present emit light, such portions are the self-light-emission regions 100a, and edges of the self-lightemission regions 100a in the column direction are defined by column-direction edges of the row banks 122X.

Portions of the light emitting layers 123 above side surfaces and top surfaces of the row banks 122X do not emit light, and such portions are the non-self-light-emission regions 100b. The light emitting layers 123 are disposed on top surfaces of the hole transport layers 121 in the self-light-emission regions 100a, and are disposed on top surfaces of the hole transport layers 121 on top and side surfaces of the row banks 122X in the non-self-light-emission regions 100b.

The light emitting layers 123 extend continuously not only in the self-light-emission regions 100a but also across the non-self-light-emission regions 100b that are adjacent in the column direction. In this way, when forming the light emitting layers 123, ink applied to the self-light-emission regions 100a can flow in the column direction via ink applied to the non-self-light-emission regions 100b, making equalizing of film thickness between pixels in the column direction possible. However, in the non-self-light-emission regions 100b, ink flow is suppressed to an appropriate extent by the row banks 122X. Accordingly, large amounts of unevenness in film thickness in the column direction are unlikely to occur, and luminance evenness between pixels is improved.

In plan view, width of the organic light emitting layers 123 in the row direction, defined by the gaps 522z between the column banks 522Y, irregularly and/or aperiodically changes in the column direction at minimum intervals Pi equal to or less than the pitch in the column direction of the pixel electrodes 119, and these changes are different for each of the organic light emitting layers 123. Further details of the light emitting layers 123 are provided later.

(6) Electron Transport Layer 124

As illustrated in FIG. 5, the electron transport layer 124 is layered covering the column banks 522Y and the gaps 522z defined by the column banks 522Y. The electron transport layer 124 is continuous across at least the entire display area of the organic EL display panel 10. The electron transport layer 124 includes, in order from the substrate 100x, an electron transport layer 124A made of a metal oxide, fluoride, or the like, and an electron transport layer 124B that is primarily an organic substance layered on the electron transport layer 124A (collectively also referred to as "the electron transport layer 124").

As illustrated in FIG. 5, the electron transport layer 124 is formed on the light emitting layers 123. The electron transport layer 124 has a function of transporting electrons from the common electrode layer 125 to the light emitting layers 123 and a function of restricting injection of electrons into the light emitting layers 123.

(7) Common Electrode Layer 125 (Counter Electrode Layer)

As illustrated in FIG. 5, the common electrode layer 125 is formed on the electron transport layer 124. The common electrode layer 125 is an electrode common to the light emitting layers 123. The common electrode layer 125 includes, in this order from the substrate 100x, a common electrode layer 125A made of a metal oxide and a common electrode layer 125B that is primarily metal layered on the common electrode layer 125A (collectively also referred to as "common electrode layer 125").

As illustrated in FIG. 5, the common electrode layer 125 is also in a region above the pixel electrodes 119 on the electron transport layer 124. The common electrode layer 125 forms a conduction path paired with the pixel electrodes 119, sandwiching the light emitting layers 123. The common electrode layer 125 supplies carriers to the light emitting layers 123. For example, in the case of the common electrode layer 125 functioning as a cathode, it supplies electrons to the light emitting layers 123.

As illustrated in FIG. 5, the common electrode layer 125B is primarily only on a top surface of the common electrode layer 125A.

(8) Sealing Layer 126

The sealing layer 126 covers the common electrode layer 125. The sealing layer 126 is for suppressing deterioration of the light emitting layers 123 caused by contact with moisture, air, and the like. The sealing layer 126 is formed to cover the top surface of the common electrode layer 125.

(9) Joining Layer 127

Above the sealing layer 126 in the Z axis direction is a color filter substrate 131 including an upper substrate 130 and a color filter layer 128 disposed below the upper substrate 130 in the Z axis direction. The color filter substrate 131 is joined to the sealing layer 126 by a joining layer 127. The joining layer 127 has a function of joining the color filter substrate 131 to a "back panel" consisting of each layer from the substrate 100x to the sealing layer 126, and has a function of preventing each layer from being exposed to moisture and air.

1.4.2. Components of Color Filter Substrate (1) Upper Substrate 130

The color filter substrate 131, which includes the upper substrate 130 and the color filter layer 128, is disposed on and joined to the joining layer 127. The display panel 10 is a top-emission type of panel and therefore, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like.

(2) Color Filter Layer 128

The color filter layer 128 is formed on the upper substrate 130 at positions corresponding to each of the self-light-emission regions 100a of pixels. The color filter layer 128 is a light-transmissive layer provided for allowing transmission of visible light of wavelengths corresponding to R, G, and B and has a function of transmitting light emitted from each color pixel and correcting chromaticity of the transmitted light. For example, according to the present embodiment, red, green, and blue color filter layers 128R, 128G, and 128B are formed above self-light-emission regions 100aR in the red gaps 522zR, the self-light-emission regions 100aG in the green gaps 522zG, and the self-light-emission regions 100aB in the blue gaps 522zB, respectively.

(3) Light Shielding Layer 129

The light shielding layer 129 is formed on the upper substrate 130 in positions corresponding to boundaries between self-light-emission regions 100a of pixels. The light shielding layer 129 is a black resin layer provided to prevent transmission of visible light of wavelengths corresponding to R, G, and B. For example, the light shielding layer is made of a resin material including black pigment with excellent light absorption and light shielding properties.

1.4.3. Component Materials

Examples of materials included in layers illustrated in FIG. 5 are provided below.

(1) Substrate 100x (TFT Substrate)

For the base, for example, a glass substrate, a silica glass substrate, a silicon substrate, a metal substrate of a metal such as molybdenum sulfide, copper, zinc, aluminum, stainless steel, magnesium, iron, nickel, gold, or silver, a semiconductor substrate such as gallium arsenide, a plastic substrate, or the like can be used.

The TFT layer includes TFT circuits formed on the base 100p, an inorganic insulating layer (not illustrated) formed on the TFT circuits, and the planarizing layer 118. The TFT circuits consist of a plurality of TFTs and wiring formed on a top layer of the base. Each TFT electrically connects a corresponding one of the pixel electrodes 119 to an external power source in accordance with a drive signal from an external circuit of the organic EL element 100, and is a multilayer structure including layers such as an electrode, a semiconductor layer, and an insulating layer. The wiring electrically connects the TFTs, the pixel electrodes 119, the external power source, external circuits, and the like.

Publicly known materials can be used for TFT elements such as gate electrodes, gate insulating layers, channel layers, channel protection layers, source electrodes, drain electrodes, and the like.

As a material of the planarizing layer 118 on a top surface of the substrate 100x, an organic compound such as polyimide resin, acrylic resin, siloxane resin, novalac-type phenolic resin, or the like can be used.

(2) Pixel Electrodes 119

The pixel electrodes 119 are made of a metal material. In the case of the organic EL display panel 10 pertaining to the present embodiment, which is a top-emission type, chromaticity of emitted light is adjusted and luminance increased by adoption of an optical resonator structure for which thickness is optimized, and therefore a surface portion of the pixel electrodes 119 has a high reflectivity. The pixel electrodes 119 in the organic EL display panel 10 pertaining to the present embodiment may have a structure in which a plurality of films selected from a metal layer, an alloy layer, and a light-transmissive conductive layer are layered. The metal layer can be made from a metal material including, for example, silver (Ag) or aluminum (Al) as a material that has low sheet resistance and high light reflectivity. For example, an aluminum (Al) alloy has a high light reflectivity from 80% to 95% and a low electrical resistivity of $2.82 \times 10^{-8}$ ($10$ n$\Omega \cdot$m), and is therefore an appropriate material of the pixel electrodes 110.

Aside from an aluminum alloy metal layer, from the viewpoint of high reflectivity, silver, a silver alloy, or the like can be used. As a material of the light-transmissive conductive layer, indium tin oxide (ITO), indium zinc oxide (IZO), or the like can be used. Further, from the viewpoint of cost, it is beneficial to use a metal layer or an alloy layer that is primarily aluminum.

(3) Hole Injection Layers 120

The hole injection layers 120A are layers made of an oxide such as silver (Ag), molybdenum (Mo), chromium (Cr), vanadium (V), tungsten (W), nickel (Ni), iridium (Ir), or the like. When the hole injection layers 120A include a transition metal oxide, multiple valences and multiple energy levels can be taken. As a result, hole injection is facilitated, and a reduction in drive voltage becomes possible.

The hole injection layers 120B, as described above, can be formed by using, for example, an applied film made from an organic polymer solution of an electrically-conductive polymer material such as poly(3,4-ethylenedioxythiophene) polystyrene sulfonate (PEDOT:PSS).

(4) Banks 122

The banks 122 are formed by using an organic material such as a resin, and are insulative. As examples of the organic material used to form the banks 122, acrylic resin, polyimide resin, novalac-type phenolic resin, or the like may be used. The banks 122 beneficially have an organic solvent resistance. More beneficially, acrylic resin is used, because acrylic resin has a low refractive index and is appropriate as a reflector.

Alternatively, when an inorganic material is used for the banks 122, use of silicon oxide (SiO), for example, is beneficial from the viewpoint of an appropriate refractive index. Alternatively, for example, an inorganic material such as silicon nitride (SiN), silicon oxynitride (SiON), or the like can be used.

Further, as the banks 122 may be treated with etching, baking, and the like during a manufacturing process, the banks 122 are beneficially formed by using a highly resistant material that does not excessively deform or change due to such treatments.

In order to make surfaces of the banks 122 liquid-repellant, the surfaces can be treated with fluorine. Further, the banks 122 may be formed by using a material that includes fluorine. Further, in order to lower liquid repellency of surfaces of the banks 122, ultraviolet irradiation of the banks 122 and/or low temperature baking of the banks 122 may be performed.

(5) Hole Transport Layers 121

For the hole transport layers 121, for example, a polyfluorene or a derivative thereof, a polymer compound such as a polyarylamine, which is an amine organic polymer, or a derivative thereof, poly(9, 9-di-n-octylfluorene-alt-(1, 4-phenylene-((4-sec-butylphenyl)imino)-1, 4-phenylene) (TFB), or the like can be used.

(6) Light Emitting Layers 123

The light emitting layers 123, as described above, have a function of emitting light in an excited state generated by recombination of injected holes and electrons. Thus, the light emitting layers 123 are formed by using an organic material that can emit light and can be made into a film by using a wet printing method.

In particular, for example, the light emitting layers 123 are beneficially formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like.

(7) Electron Transport Layer 124

An organic material with high electron transportability is used in the electron transport layer 124. The electron transport layer 124A may include a layer formed by sodium fluoride. An example of an organic material that may be used in the electron transport layer 124B is a π electron low molecular weight organic material such as an oxadiazole derivative (OXD), a triazole derivative (TAZ), a phenanthroline derivative (BCP, Bphen), or the like.

Further, the electron transport layer 124B may include a layer formed by doping a high electron transporting property organic material with a metal dopant selected from alkali metals or alkaline earth metals.

(8) Common Electrode Layer 125

An electrically conductive light-transmissive material is used as the common electrode layer 125A. For example, the common electrode layer 125A may be formed by using indium tin oxide (ITO), indium zinc oxide (IZO), or the like.

The common electrode layer 125B is formed by using silver (Ag), aluminium (Al), or the like as a thin film electrode.

(9) Sealing Layer 126

The sealing layer 126 is formed by using, for example, a light-transmissive material such as silicon nitride (SiN), silicon oxynitride (SiON), or the like. Further, a sealing resin layer made of a resin material such as acrylic resin, silicone resin, or the like may be provided on the layer formed by using the material such as silicon nitride (SiN), silicon oxynitride (SiON), or the like.

In the case of a top-emission type of display panel, the sealing layer 126 is formed by using a light-transmissive material.

(10) Joining Layer 127

The joining layer 127 is made of a material such as a resin adhesive, for example. For the joining layer 127, a light transmissive resin material such as acrylic resin, silicone resin, epoxy resin, or the like can be used.

(11) Upper Substrate 130

As the upper substrate 130, for example, a light transmissive material such as a glass substrate, a silica glass substrate, or a plastic substrate can be used.

(12) Color Filter Layer 128

As the color filter layer 128, a publicly known resin material (for example, as a commercially available product, color resists manufactured by JSR Corporation) or the like can be used.

(13) Light Shielding Layer 129

The light shielding layer 129 is made of a resin material that is primarily an ultraviolet curable resin (for example, ultraviolet curable acrylic resin) material to which a black pigment is added. As the black pigment, for example, a light shielding material such as a carbon black pigment, a titanium black pigment, a metal oxide pigment, an organic pigment, or the like can be used.

2. Details of Column Banks 522Y, Light Emitting Layers 123

Further details of structure of the column banks 522Y is provided below.

Figure 6A:
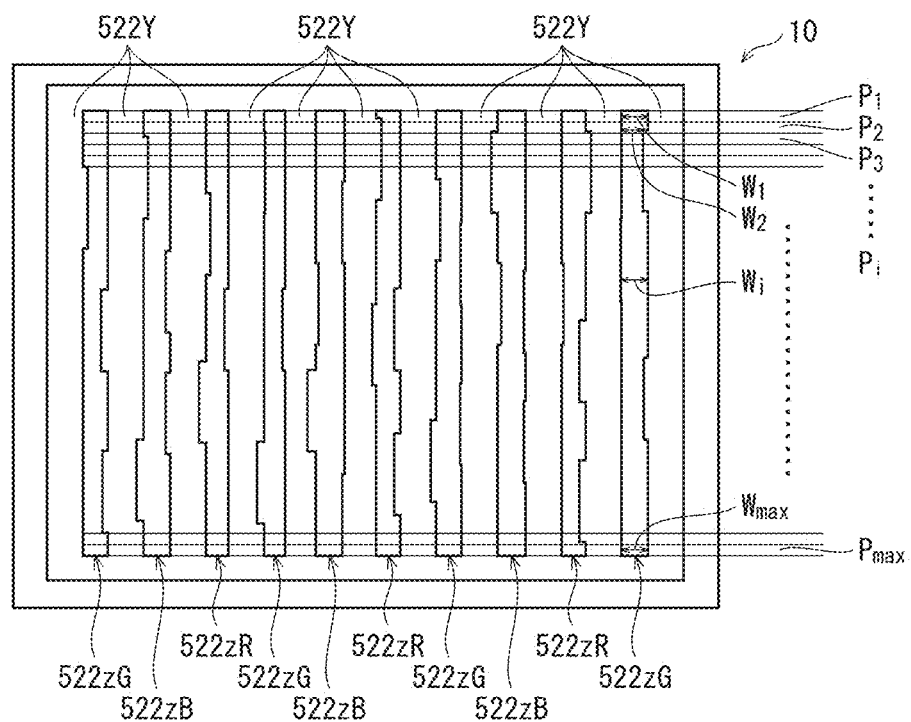
FIG. 6A is a schematic plan view diagram of a substrate 100x of the display panel 10 with column banks 522Y according to at least one embodiment and FIG. 6B is a schematic plan view of the substrate 100x of the display panel 10 with organic light emitting layers 123G disposed in gaps 522zG between the column banks 522Y according to at least one embodiment.

FIG. 6A is a schematic plan view of the substrate 100x of the display panel 10 provided with the column banks 522Y. As illustrated in FIG. 6A, a plurality of the column banks 522Y extend in the column direction and are arranged side-by-side in the row direction; width of each of the column banks 522Y irregularly and/or aperiodically changes along the column direction at a minimum interval Pi (i=1 . . . max) equal to or less than pitch in the column direction of the pixel electrodes 119; and these changes in the column direction are different for each of the column banks 522Y. Thus, width Wi (i=1 . . . max) in the row direction of the organic light emitting layers 123 that is defined by width of the gaps 522z between the column banks 522Y changes irregularly and/or aperiodically at the minimum interval Pi that is equal to or less than the pitch in the column direction of the pixel electrodes 119, and changes in the width Wi in the column direction are different for each of the organic light emitting layers 123.

Figure 6B:
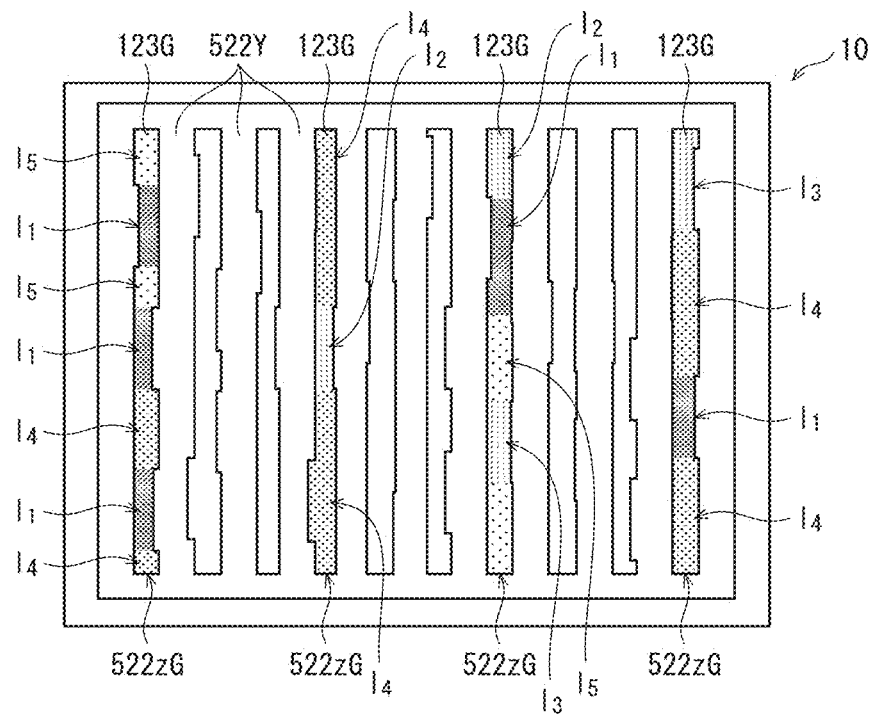

FIG. 6B is a schematic plan view of the substrate 100x of the display panel 10 with the organic light emitting layers 123G provided in the gaps 522zG between the column banks 522Y that are adjacent to each other. Magnitude of luminance 1 of light emitted from each pixel of the organic light emitting layers 123G is proportional to area of each pixel of the organic light emitting layers 123, and changes according to the width Wi in the row direction of the organic light emitting layers 123. In FIG. 6B, the magnitude of the luminance 1 of light emitted from each pixel of the organic light emitting layers 123G is indicated in the drawing in five levels from 11 to 15, corresponding to the width Wi.

In the display panel 10, by irregularly and/or aperiodically changing the width Wi in the row direction of the organic light emitting layers 123 at the minimum interval Pi that is equal to or less than the pitch of the pixel electrodes 119 in the column direction, in a different manner to film thickness variation of the organic light emitting layers 123 in a direction parallel to a nozzle column caused by factors such as variation in ink droplet D size ejected from the inkjet head illustrated in FIG. 16B, the magnitude of the luminance 1 of light emitted from each pixel of the organic light emitting layers 123G is changed irregularly and/or aperiodically in the column direction. Changes in the luminance 1, based on changes of the width Wi in the column direction, are different for each of the organic light emitting layers 123.

By superimposing modulated luminance distribution that varies differently from row direction streaks of luminance unevenness with the row direction streaks of luminance unevenness caused by variation in functional layer film thickness in the column direction that is common across layers in the row direction, the row direction streaks of luminance unevenness are made to stand out less.

Figure 7:
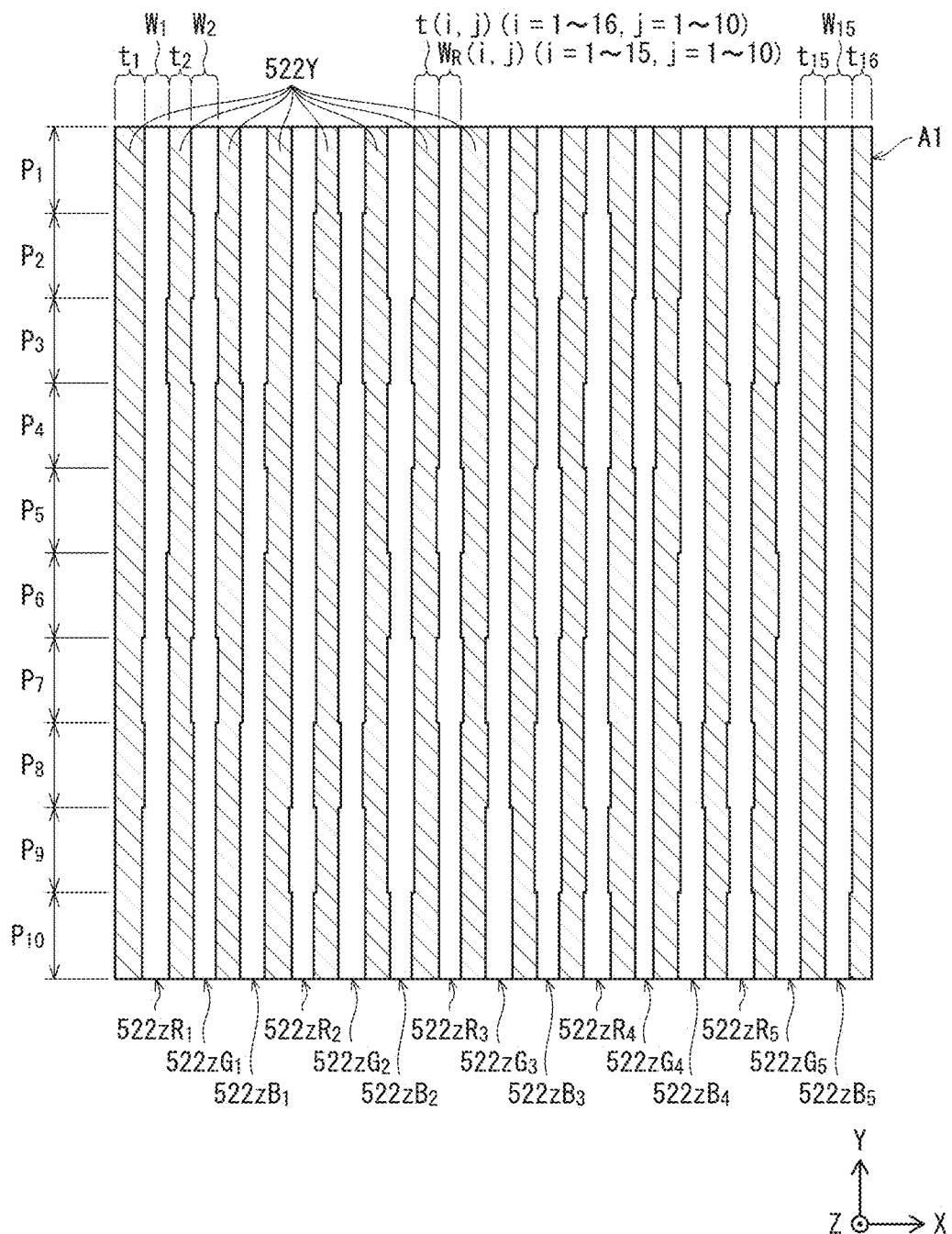
FIG. 7 is an enlargement of portion A1 from FIG. 3, and is a schematic plan view diagram illustrating the column banks 522Y of the display panel 10 according to at least one embodiment.

FIG. 7 is a schematic plan view illustrating an aspect of the column banks 522Y of the display panel 10, and is an enlargement of a rectangular region A1 in FIG. 3. The rectangular region A1 includes at least five pixels in the row direction and at least ten pixels in the column direction, i.e., at least 15 sub-pixels in the row direction and at least ten sub-pixels in the column direction. In FIG. 7, sub-pixels in the X, Y directions are indicated by indices i, j. When, in the X, Y directions, width of the column banks 522Y corresponding to (i, j)-th sub-pixels (where i=1 . . . 15, j=1 . . . 10) is defined as t(i, j) (where i=1 . . . 16, j=1 . . . 10), width in the row direction of the organic light emitting layers 123 defined by width of the gaps 522z between the column banks 522Y is defined as W(i, j) (where i=1 . . . 16, j=1 . . . 10), a maximum value (design maximum value) of W(i, j) is Wmax, a minimum value (design maximum value) of W(i, j) is Wmin, an average value of W(i, j) (design typical value) is Wtyp and an average value of t(i, j) (design typical value) is ttyp, the width W(i, j) in the row direction of the organic light emitting layers 123 is defined by Equation 1, and the width t(i, j) of the column banks 522Y is defined by Equation 2.

[Math 1]

$$W(i, j) = \text{random number} \times (W_{max} - W_{min}) + W_{min} \quad \text{(Equation 1)}$$

[Math 2]

$$t(i, j) = \frac{W_{typ} - W_{(i-1,j)}}{2} + \frac{(W_{typ} - W_{i+1,j})}{2} + t_{typ} \quad \text{(Equation 2)}$$

Here, in Equation 1, as a random number generation method, a Monte Carlo method can be used, for example and random numbers are defined from 0 to 1.

Further, a difference between Wmax and Wmin is beneficially from 1 μm to 2 μm.

Further, according to the embodiment described above, the width of the column banks 522Y is modified according to pixel (sub-pixel) pitch in the column direction, but may be modified according to a minimum interval less than the pixel pitch in the column direction. For example, a minimum interval of modification may be equal to or less than a nozzle pitch of an inkjet head used for forming the organic light emitting layers 123, for example 22 μm or less. Alternatively, the minimum interval may be ⅙ or less of the pitch of the pixel electrodes 119 in the column direction.

Further, changes in the column direction of the width W(i, j) defined by Equation 1 are characterized by being different for each of the organic light emitting layers 123, i.e., different changes are indicated in the row direction. More specifically, a degree of similarity between two sequences is equal to or less than a defined value, where a sequence consists of widths W(i, j) in the row direction of one of the organic light emitting layers 123 in a plurality of positions j in the column direction between an adjacent pair of column insulating layers selected from a plurality of the column banks 522Y. For example, when two different sequences each consisting of widths of different ones of the organic light emitting layers 123 in the row direction at a plurality of positions j in the column direction between pairs of the column banks 522Y are defined as W1 and W2, an absolute value of a cross-correlation coefficient R12 between the sequences, as defined by Equation 3, is beneficially 0.4 or less, and more beneficially 0.2 or less.

[Math 3]

$$R_{12}(\tau) = \int_0^{ymax} W_1(y) W_2(y-\tau) dy \quad \text{(Equation 3)}$$

This makes it possible to suppress changes of the width W(i, j) in the column direction being recognized as streaks of luminance unevenness in the row direction.

Alternatively, when three column insulating layers that are adjacent in the row direction are selected from the column banks 522Y and referred to as a first column insulating layer, a second column insulating layer, and a third column insulating layer, and an absolute value of a cross-correlation coefficient between a sequence consisting of widths in the row direction of an organic light emitting layer at positions in the column direction between the first column insulating layer and the second column insulating layer and a sequence consisting of widths in the row direction of an organic light emitting layer at positions in the column direction between the second column insulating layer and the third column insulating layer is referred to as an adjacent correlation value, an average of adjacent correlation values calculated from selections of three column insulating layers from all of the column banks 522Y may be configured to equal 0.2 or less. This configuration makes it possible to suppress recognition of changes of the width W(i, j) in the column direction as streaks of luminance unevenness in the row direction.

Further, a range of change in width of the organic light emitting layers 123 in the row direction, i.e., a difference between Wmax and Wmin, may be larger as a wavelength of light emitted by the organic light emitting layers is shorter. The influence on optical paths caused by minute variation in film thickness is greater the shorter the wavelength of light, making it easier to recognize luminance unevenness, and therefore superimposing larger changes in luminance is effective in making the unevenness stand out less.

The rectangular region A1 has been described as including at least five pixels in the row direction and at least ten pixels in the column direction, but may be a larger rectangular region.

The rectangular region A1 may be repeated in the row direction and in the column direction on the substrate 100x. By setting the rectangular region A1 to be a range including at least five pixels in the row direction and ten pixels in the column direction, even when the rectangular region A1 is repeated in the row direction and the column direction it is made difficult to recognize the repetition as periodic unevenness. Further, a range of random numbers generated to define the width W (i, j) of the organic light emitting layers 123 in the row direction can be limited to the rectangular region A1, and therefore design of the substrate 100x can be made simpler.

3. Method of Manufacturing Display Panel 10

A method of manufacturing the display panel 10 is described with reference to FIG. 8A to FIG. 13B. Each of the drawings in FIG. 8A to FIG. 10D and FIG. 12A to FIG. 13B is a schematic cross section taken at a position corresponding to A2-A2 in FIG. 4 illustrating a state in a process of manufacturing the display panel 10.

(1) Preparing Substrate 100x

Figure 8A:
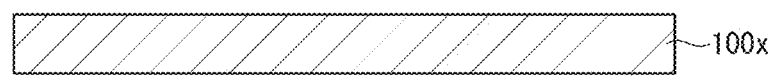
FIG. 8A, 8B, 8C, 8D are schematic cross section diagrams taken from the same location as A2-A2 in FIG. 4 illustrating processes in manufacturing of the display panel 10 according to at least one embodiment.

The substrate 100x on which TFTs and wiring are formed is prepared. The substrate 100x can be manufactured by using a publicly known TFT manufacturing method (FIG. 8A).

(2) Forming Planarizing Layer 118

Figure 8B:
Figure 8C:
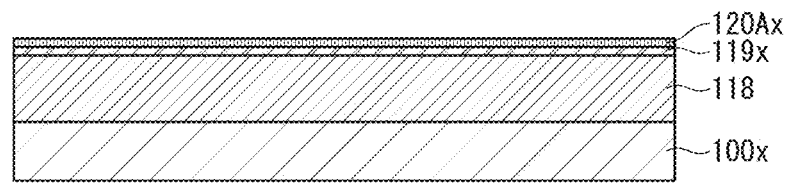

The planarizing layer 118 is formed by coating the substrate 100x with a component material (photosensitive resin material) of the planarizing layer 118 as a photoresist, and by planarizing the coated surface (FIG. 8B).

(3) Forming Pixel Electrodes 119 and Hole Injection Layers 120A

After forming a metal film by using a vapor phase growth method such as sputtering or vacuum deposition, patterning is performed by using photolithography and etching.

More specifically, first, after forming the planarizing layer 118, dry etching processing is applied to a surface of the planarizing layer 118 to perform cleaning prior to film formation.

Next, after pre-film-formation cleaning of the surface of the planarizing layer 118, a second metal layer 119X for forming the pixel electrodes 119 is formed on the surface of the planarizing layer 118 by using a vapor phase growth method. According to the present embodiment, the second metal layer 119X is a film made of aluminum or an alloy that is primarily aluminum formed by using a sputtering method.

After pre-film-formation cleaning of a surface of the second metal layer 119X, a third metal layer 120AX for forming the hole injection layers 120A is formed on the surface of the second metal layer 119X by using a vapor phase growth method. According to the present embodiment, the third metal layer 120AX is formed by sputtering tungsten.

Figure 8D:
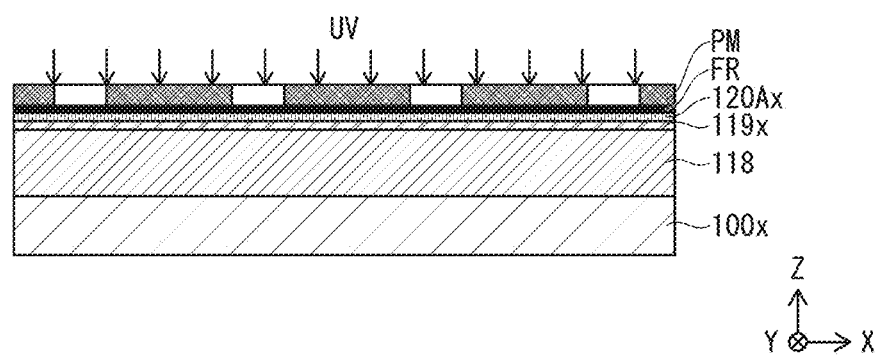

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 8D). Next, the photoresist layer FR is patterned by developing.

Subsequently, patterning of the third metal layer 120AX and the second metal layer 119X is performed by etching processing via the patterned photoresist layer FR, thereby forming the hole injection layers 120A and the pixel electrodes 119.

Figure 9A:
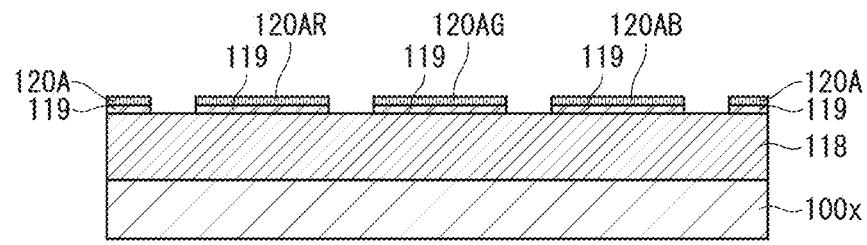
FIG. 9A, 9B, 9C are schematic cross section diagrams taken from the same location as A2-A2 in FIG. 4 illustrating processes in manufacturing of the display panel 10 according to at least one embodiment.

Finally, the photoresist layer FR is peeled off, leaving the pixel electrodes 119 and the hole injection layers 120A patterned in the same shapes (FIG. 9A).

(4) Forming Banks 122

Figure 9B:
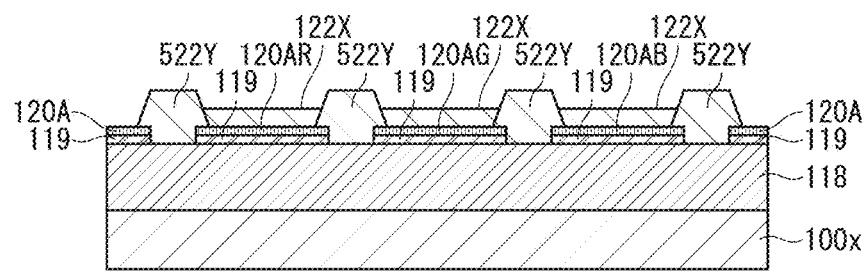

After forming the hole injection layers 120A of the hole injection layers 120, the banks 122 that partially cover the hole injection layers 120A are formed. In forming the banks 122, first the row banks 122X are formed and subsequently the column banks 522Y are formed, thereby forming the gaps 522z (FIG. 9B).

To form the banks 122, first, a film made of a material of the banks 122 (for example, a photosensitive resin material) is layered on the hole injection layers 120A by using a spin coating method or the like. Then the resin film is patterned to form the row banks 122X.

Patterning of the row banks 122X is performed by light exposure using a photomask above the resin film, developing, and baking (at approximately 230° C. for approximately 60 minutes).

Next, to form the column banks 522Y, a film made of a material of the column banks 522Y (for example, a photosensitive resin material) is layered on the hole injection layers 120A and the row banks 122X by using a spin coating method or the like. Forming the gaps 522z is performed by positioning a mask above the resin film, exposing it to light, then developing to pattern the resin film to form the gaps 522z and the column banks 522Y.

More specifically, when forming the column banks 522Y, a photosensitive resin film made of an organic photosensitive resin material such as acrylic resin, polyimide resin, novolac-type phenolic resin, or the like is formed. After drying to partially volatize solvent, a photomask provided with defined openings is overlaid, and ultraviolet irradiation is performed from above to expose a photoresist made of the photosensitive resin or the like, transferring the pattern of the photomask to the photoresist.

The photomask is provided with openings having shapes such that width of each of the column banks 522Y to be transferred changes irregularly and/or aperiodically in the column direction with a minimum interval equal to or less than the pitch of the pixel electrodes 119 in the column direction, the openings resulting in differences in widths along the column direction between each of the column banks 522Y. Alternatively, the photomask may have rectangular regions that are repeated in the row and column directions, each of the rectangular regions including a defined number or more of pixels in the row and column directions, and openings in the photomask such that widths of the column banks 522Y to be transferred vary irregularly and/or aperiodically in the column direction, and changes of each of the column banks 522Y are different. By use of the photomask, the column banks 522Y can be patterned to the shapes illustrated in FIG. 7.

Next, insulating layers that are the column banks 522Y patterned by developing of the photosensitive resin are baked (at approximately 230° C. for approximately 60 minutes). Typically, a positive type of photoresist is used. According to a positive type of photoresist, portions exposed to light are removed by developing. The unexposed portions of the photoresist under the pattern mask remain without being developed.

As described above, the hole injection layers 120A are patterned per pixel unit by using photolithography and etching after a film made of metal (for example, tungsten) is formed by using a vapor phase growth method such as sputtering or vacuum deposition, but it is in the baking of the row banks 122X and the column banks 522Y that the metal is oxidized to complete the hole injection layers 120A.

The column banks 522Y extend in the column direction and alternate in the row direction with the gaps 522z.

(5) Forming Organic Functional Layers

Figure 9C:
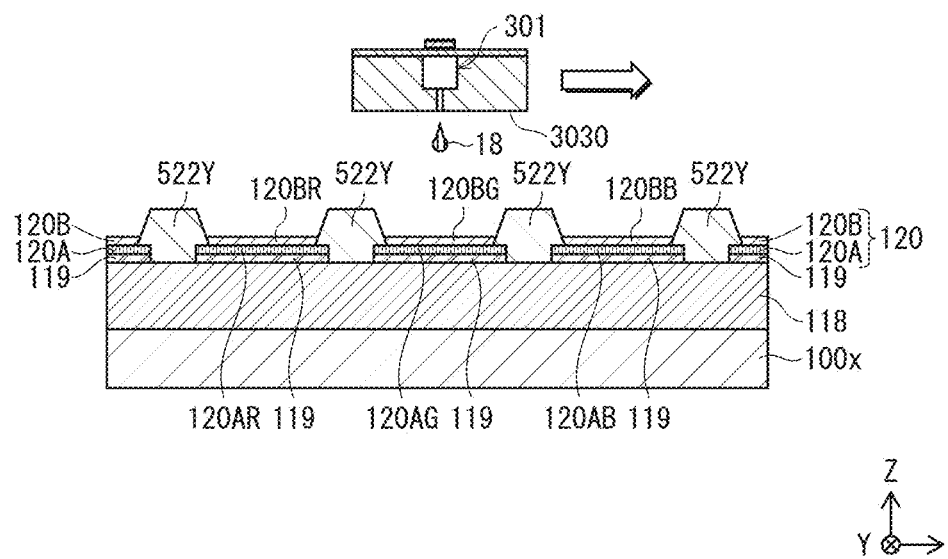

On the hole injection layers 120A of the hole injection layers 120 formed in the gaps 522z defined by the column banks 522Y including on and above the row banks 122X, the hole injection layers 120B of the hole injection layers 120, the hole transport layers 121, and the light emitting layers 123 are layered in this order (FIG. 9C).

The upper layers 120B are formed by using an inkjet method to apply an ink including an electrically conductive polymer material such as a poly(3,4-ethylenedioxythiophene) polystyrene sulfonate (PEDOT:PSS) into the gaps 522z defined by the column banks 522Y, then removing a solvent by volatilization or by baking. Subsequently, patterning of each pixel unit may be performed by using photolithography and etching.

Figure 10A:
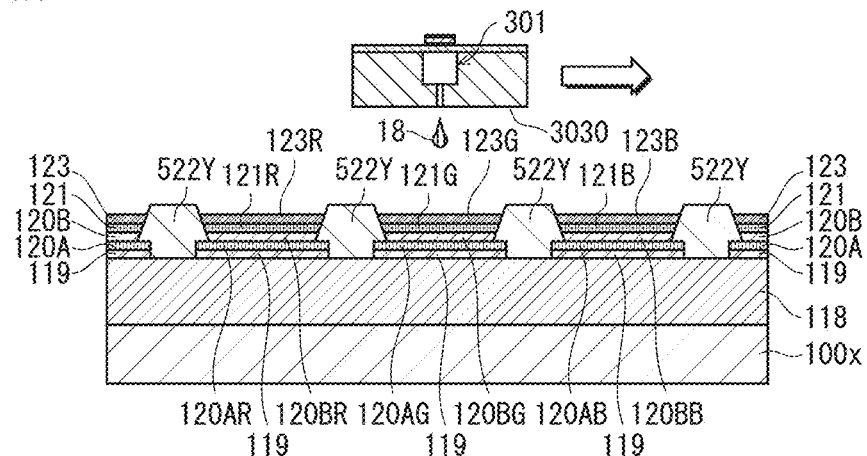
FIG. 10A, 10B, 10C, 10D are schematic cross section diagrams taken from the same location as A2-A2 in FIG. 4 illustrating processes in manufacturing of the display panel 10 according to at least one embodiment.

The hole transport layers 121 are formed by using a wet process such an inkjet method or gravure printing method to apply ink including a material of the hole transport layers 121 into the gaps 522z defined by the column banks 522Y, then removing a solvent by volatilization or by baking (FIG. 10A). The method of applying ink for forming the hole transport layers 121 into the gaps 522z is the same as the method used for the hole injection layer 120B.

The light emitting layers 123 are formed by using an inkjet method to apply ink including a material of the light emitting layers 123 into the gaps 522z defined by the column banks 522Y, then baking (FIG. 10A). More specifically, in this process, inks 123RI, 123GI, and 123BI including R, G, and B organic light emitting layer material, respectively, are applied by using an inkjet method into the gaps 522z, which are sub pixel formation regions. The inks are then dried under low pressure and baked to form the light emitting layers 123R, 123G, and 123B. In applying the ink of the light emitting layers 123, a solution for forming the light emitting layers 123 is applied by using a droplet ejecting device. Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied in order. As a result, red light emitting layers, green light emitting layers, and blue light emitting layers repeatedly alternate across the substrate 100x in the row direction.

(Method of Uniform Application to Gaps 522z Between Column Banks 522Y)

The following is a detailed description of use of an inkjet method to apply ink of the light emitting layers 123 into the gaps 522z. FIG. 16A is a schematic plan view diagram illustrating a process of uniformly applying ink for forming light emitting layers to the gaps 522z between the column banks 522Y.

The following is a description of application of ink into gaps for one color (for example, ink for red gaps). The light emitting layers 123 extend continuously not only in the self-light-emission regions 100a but also across the non-self-light-emission regions 100b that are adjacent. Thus, when forming the light emitting layers 123, ink applied to the self-light-emission regions 100a can flow in the column direction via ink applied to the non-self-light-emission regions 100b, and when an ink drying process pertaining to the present embodiment is performed, film thickness of the light emitting layers 123 between pixels in the column direction can be levelled. However, in the non-self-light-emission regions 100b, ink flow is suppressed to an appropriate extent by the row banks 122X, which extend in the X direction and are low in height. Accordingly, large amounts of unevenness in film thickness in the column direction are unlikely to occur, luminance evenness between pixels is improved, and uneven pixel lifespan reduction can be avoided.

According to the present application method, as illustrated in FIG. 16A, the substrate 100x is placed on an operation table of the droplet ejecting device in a state in which the column banks 522Y extend in the Y direction, and while an inkjet head 301 in which nozzle holes are arranged in a line shape along the Y direction is moved relative to the substrate 100x in the X direction, ink aimed at landing targets set within the gaps 522z between the column banks 522Y is ejected from the nozzle holes to land thereon.

Note that each region to which an ink amount of one of the light emitting layers 123 is applied is one region among three regions arranged side-by-side in the X direction.

When forming the light emitting layers 123 in three colors—RGB—an amount of ink to be ejected from nozzles is set according to a first condition and applied to a plurality of gaps of a first color, then an amount of ink to be ejected from nozzles is set according to a second condition and applied to a plurality of gaps of a second color, then an amount of ink to be ejected from nozzles is set according to a third condition and applied to a plurality of gaps of a third color, and in this way ink is sequentially applied to gaps of all three colors.

Further, ink may be sequentially applied to gaps of three colors by repeating a process of applying ink to gaps of a first color for a plurality of substrates, then applying ink to gaps of a second color for the plurality of substrates, then applying ink to gaps of a third color for the plurality of substrates.

Methods of forming the hole injection layers 120B of the hole injection layers 120, the hole transport layers 121, and the light emitting layers 123 are not limited to those described above, and ink may be dropped and applied by a publicly known method other than an inkjet method or a gravure printing method, such as a dispenser method, a nozzle coating method, a spin coating method, intaglio printing, letterpress printing, or the like.

As described above, width of each of the column banks 522Y changes irregularly and/or aperiodically in the column direction with a minimum interval equal to or less than the pitch of the pixel electrodes 119 in the column direction, and the changes along the column direction are different for each of the column banks 522Y. Thus, when the light emitting layers 123 are formed by using a wet process such as an inkjet method in the gaps 522z between the column banks 522Y and viewed from above, widths of the light emitting layers 123 in the row direction change irregularly and/or aperiodically in the column direction with a minimum interval equal to or less than the pitch of the pixel electrodes 119 in the column direction, and the changes along the column direction are different for each of the light emitting layers 123. This is because width of the light emitting layers 123 in the row direction is defined by width of the gaps 522z between the column banks 522Y.

(6) Forming of Electron Transport Layer 124

Figure 10B:
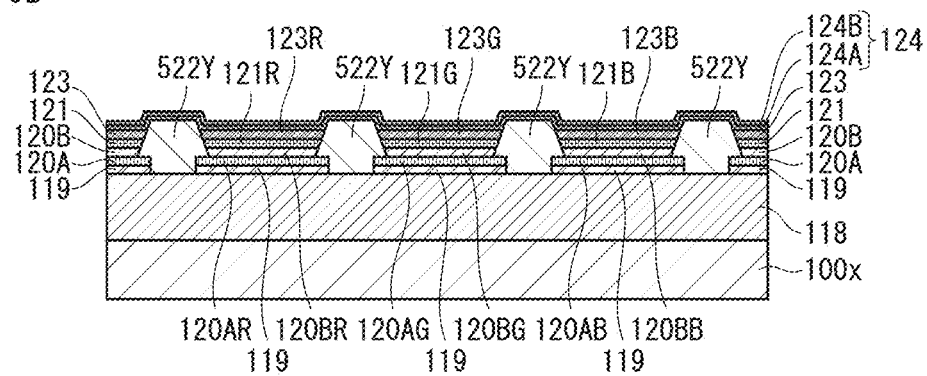

After forming the light emitting layers 123, the electron transport layer 124 is formed to be continuous across a display area of the display panel 10 by using a method such as vacuum deposition (FIG. 10B). Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124A is formed by vacuum deposition or the like of a metal oxide or fluoride on the light emitting layers 123, to have a film thickness from 1 nm to 10 nm, for example. On the electron transport layer 124A, the electron transport layer 124B is formed by co-evaporation of an organic material and a metal material, to have a film thickness from 10 nm to 50 nm, for example. Note that the above film thicknesses of the electron transport layers 124A, 124B are examples, the film thicknesses are not limited to the above values, and are set to thicknesses that are most appropriate for optical light extraction.

(7) Forming of Common Electrode Layer 125

After forming the electron transport layer 124, the common electrode layer 125 is formed so as to cover the electron transport layer 124. The common electrode layer 125 includes, in this order from the substrate 100x, the common electrode layer 125A made of a metal oxide and the common electrode layer 125B that is primarily metal layered on the common electrode layer 125A.

Figure 10C:
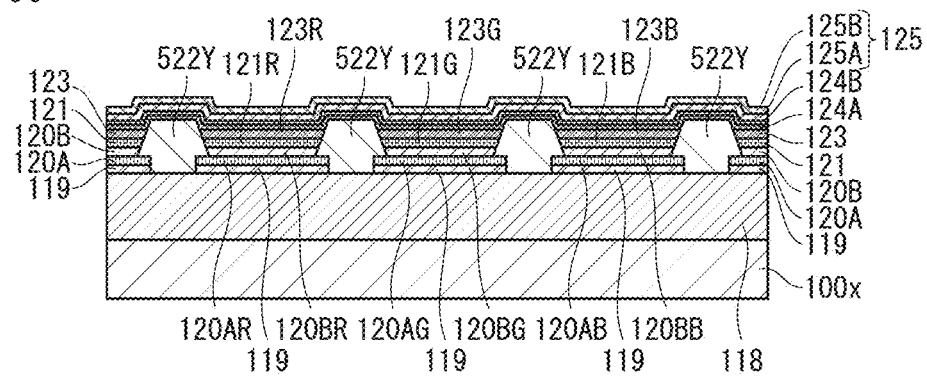

Of these, first, the common electrode layer 125A is formed by a method such as sputtering so as to cover the electron transport layer 124 (FIG. 10C). According to the present example, the common electrode layer 125A is formed by using a sputtering method to form a light-transmissive electrically-conductive layer of ITO, IZO, or the like.

Next, the common electrode layer 125B is formed on the common electrode layer 125A by using chemical vapor deposition (CVD), sputtering, or vacuum deposition (FIG. 10C). In the present example, the common electrode layer 125B is formed by depositing silver by using vacuum deposition.

(8) Forming Sealing Layer 126

Figure 10D:
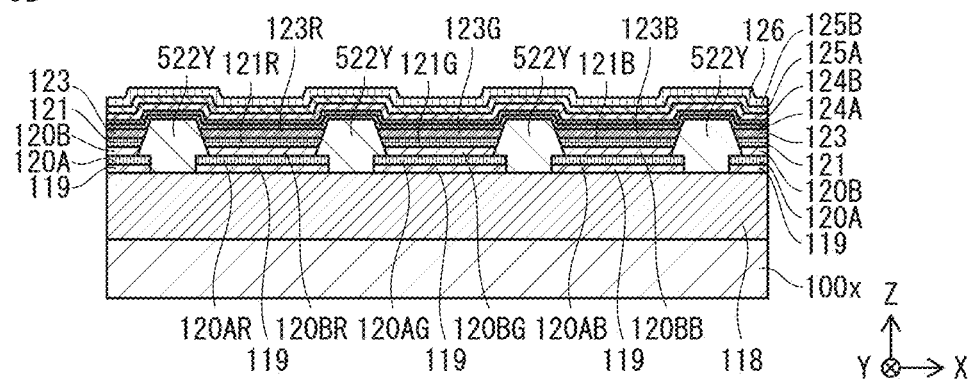
Figure 11:
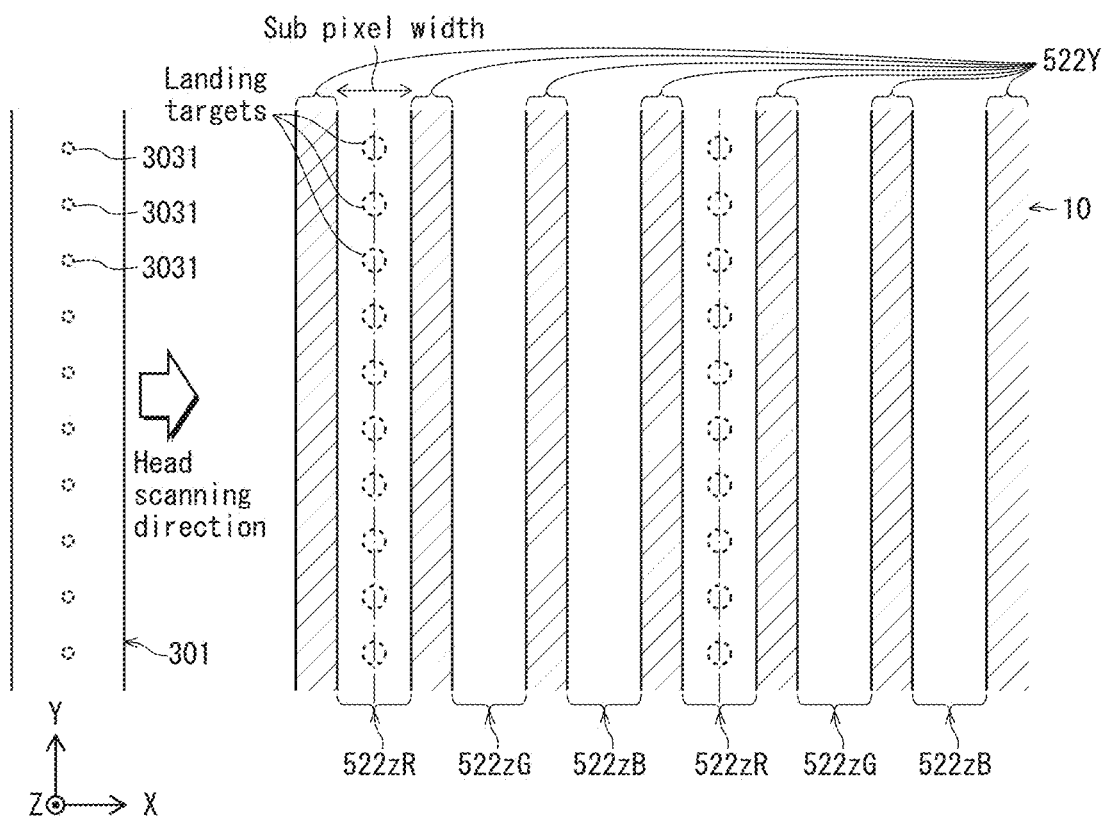
FIG. 11 is a schematic plan view diagram illustrating a process in manufacturing the display panel 10 according to at least one embodiment, in which ink for forming a light emitting layer is applied to a gap between adjacent column banks 522Y on a substrate.

After forming the common electrode layer 125, the sealing layer 126 is formed so as to cover the common electrode layer 125 (FIG. 10D). The sealing layer 126 can be formed by using CVD, sputtering, or the like.

(9) Forming Color Filter Substrate 131

Next, an example of a manufacturing process of the color filter substrate 131 is described.

Figure 12A:
FIG. 12A, 12B, 12C, 12D, 12E, 12F, 12G are schematic cross section diagrams taken from the same location as A2-A2 in FIG. 4 illustrating processes in manufacturing of the display panel 10 according to at least one embodiment.

The upper substrate 130, which is light-transmissive, is prepared, and the material of the light shielding layers 129 that is primarily an ultraviolet curable resin (for example, ultraviolet curable acrylic resin) material, to which a black pigment is added, is applied on one surface of the upper substrate 130 (FIG. 12A).

Figure 12B:
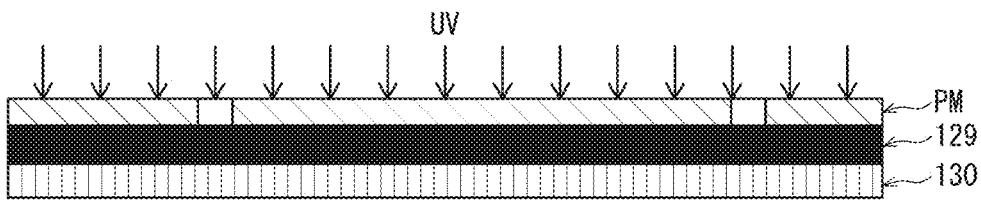

A pattern mask PM having defined openings is overlaid on an upper surface of the light shielding layer 129 and is irradiated from above with ultraviolet light (FIG. 12B).

Figure 12C:
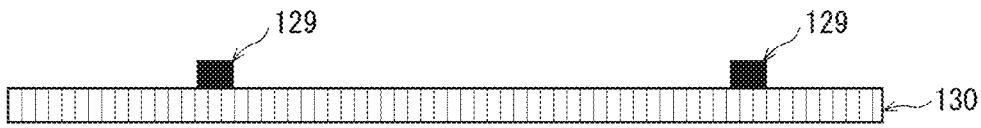

Then, by removing the pattern mask PM and uncured portions of the light shielding layer 129, developing, and curing, the light shielding layer 129 is completed and has, for example, substantially rectangular shapes in cross section (FIG. 12C).

Figure 12D:
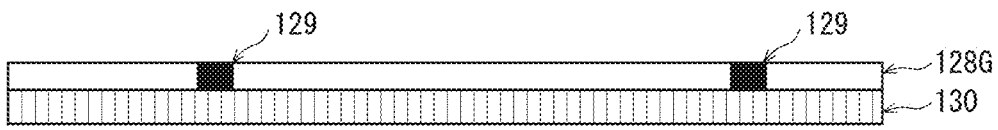
Figure 12E:
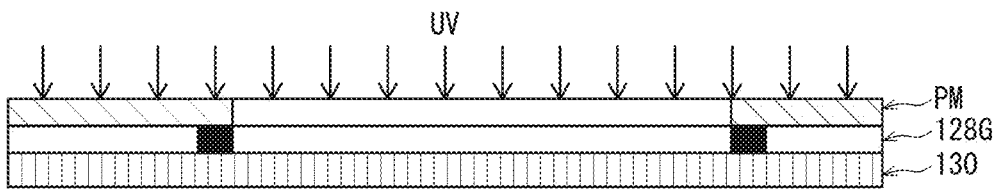

Next, a material 128G of a color filter layer 128G, for example, which is primarily an ultraviolet curable resin, is applied (FIG. 12D) to the surface of the upper substrate 130 on which the light shielding layer 129 is formed, then a defined pattern mask PM is overlaid and irradiation with ultraviolet light is performed (FIG. 12E).

Figure 12F:
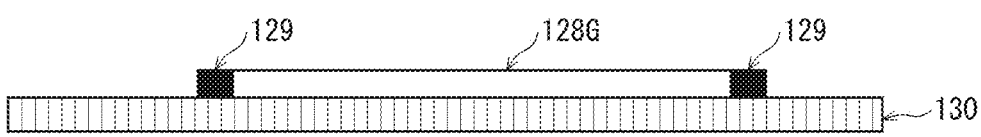
Figure 12G:
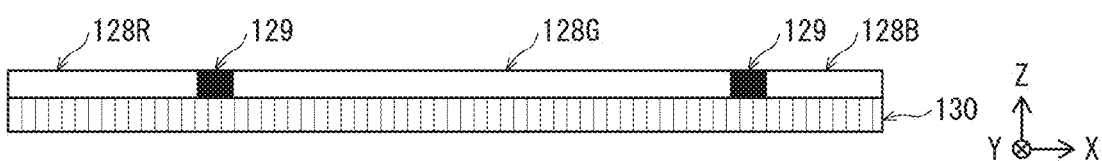

Subsequently, curing is performed, and the pattern mask PM and uncured portions of the material 128G are removed by developing to form the color filter layer 128G (FIG. 12F).

The color filter layers 128R and 128B are formed (FIG. 11G) by performing the processes in FIGS. 12D, 12E, and 12F with respect to color filter materials of each color. A commercially available color filter product may be used instead of the color filter materials 128R, 128G, 128B. Thus, the color filter substrate 131 is formed.

(10) Joining of Color Filter Substrate 131 and Back Panel

Next, a material of the joining layer 127 that is primarily an ultraviolet curable resin such as acrylic resin, silicone resin, epoxy resin, or the like, is applied to a back panel that includes every layer from the substrate 100x to the sealing layer 126 (FIG. 13A).

Next, the applied material is irradiated with ultraviolet light, and the back panel and the color filter substrate 131 are joined while matching positions relative to each other. No gas should enter between the back panel and the color filter substrate 131 at this time. Finally, a sealing process is completed by baking, thus completing the display panel 10 (FIG. 13B).

4. Experimental Confirmation of Effects

The following describes effects obtained from the display panel 10.

The inventors performed an evaluation of visibility of streaks of luminance unevenness. FIG. 14A is a schematic plan view illustrating an embodiment of the substrate 100x of the display panel 10 used for evaluation and FIG. 14B is a schematic plan view illustrating a reference example used for evaluation. The embodiment illustrated in FIG. 14A has the same specification as that illustrated in FIG. 7. The reference example illustrated in FIG. 14B is configured such that width Wi (i=1 . . . max) in the row direction of the light emitting layers 123, defined by width of the gaps 522z between the column banks 522Y, is set to be constant in the column direction. Using the substrates of the embodiment and the reference example, the ink head I was moved relative to the substrate 100x in the X direction while the nozzle column of the ink head I was parallel to the Y direction to form the light emitting layers 123, to complete the display panels. With respect to the panels of the embodiment and the reference example, a luminance corrected image signal was applied to each pixel in the column direction to drive the pixels, and luminance distribution was measured from two viewing angles: vertically above (high viewing angle) and at a 45° angle from the vertical direction (low viewing angle).

Figure 15A:
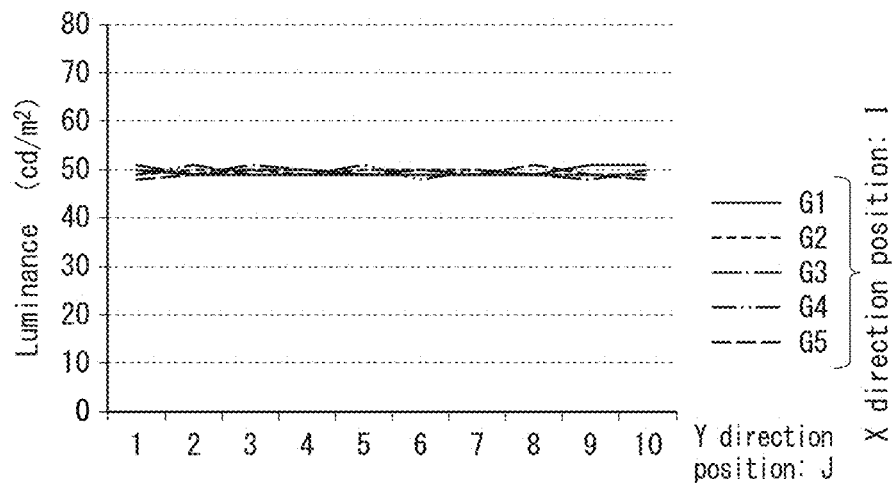
FIG. 15A is a graph of measurement results illustrating luminance distribution when a reference example of the display panel 10 is viewed from a vertical direction.
Figure 15B:
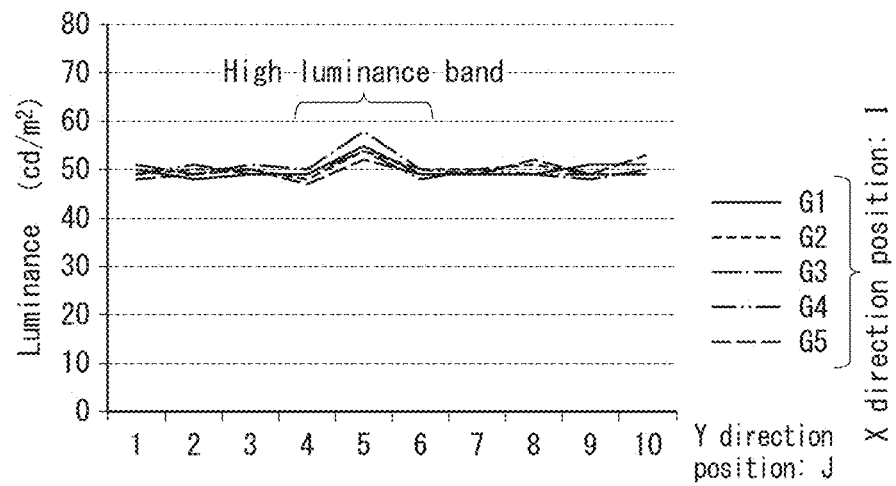
FIG. 15B is a graph of measurement results illustrating luminance distribution when the reference example is viewed at an angle of 45° from the vertical direction.
Figure 15C:
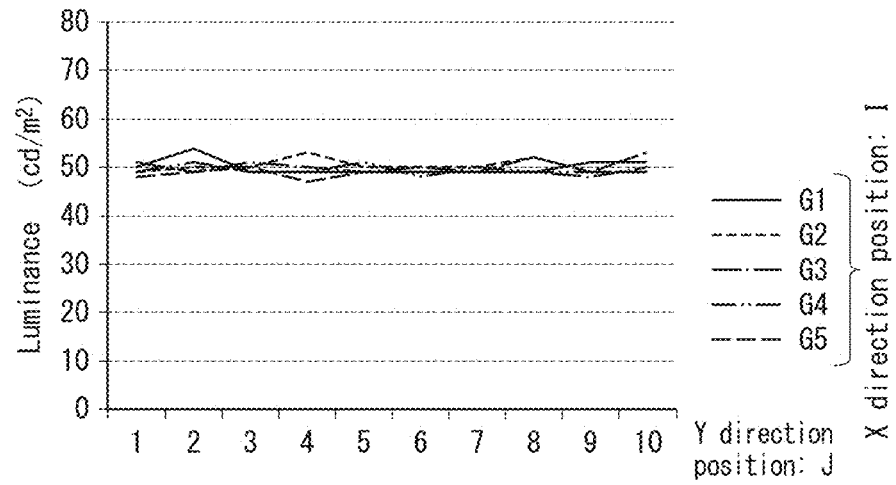
FIG. 15C is a graph of measurement results illustrating luminance distribution when an embodiment is viewed at an angle of 45° from the vertical direction.

FIG. 15A is a graph of measurement results illustrating luminance distribution when the reference example of the display panel 10 is viewed from a vertical direction; FIG. 15B is a graph of measurement results illustrating luminance distribution when the reference example is viewed at an angle of 45° from the vertical direction; and FIG. 15C is a graph of measurement results illustrating luminance distribution when the embodiment is viewed at an angle of 45° from the vertical direction. The panel of the embodiment and the reference example were cut into cross sections (corresponding to G1 to G5 in the drawings) in the column direction at different positions in the X direction from gap 522zG1 to gap 522zG5, and luminance distribution was measured for each of the cross sections in regions corresponding to 10 sub pixels in the Y direction.

As illustrated in FIG. 15A, in the luminance distribution (G1 to G5) of the reference example when viewed from the vertical direction, when a luminance-corrected image signal is applied to each pixel in the column direction, luminance variation exceeding 3% in the column direction is not observed. Thus, streaks of luminance unevenness parallel to the row direction are not recognized at all. A similar result is observed for both the embodiment and the reference example;

However, as illustrated in FIG. 15B, in the luminance distribution (G1 to G5) of the reference example when viewed from a direction at a 45° angle from the vertical direction, when a luminance-corrected image signal is applied to each pixel in the column direction, luminance variation of approximately 10% occurs in the column direction. Further, the distribution shape of the luminance variation in the column direction is similar for each line, and in particular a portion having higher than average luminance is continuous in the row direction. Thus, a high luminance band parallel to the row direction is easily recognized as a streak of luminance unevenness.

In contrast, as illustrated in FIG. 15C, in the luminance distribution (G1 to G5) of the embodiment when viewed from a direction at a 45° angle from the vertical direction, when a luminance-corrected image signal is applied to each pixel in the column direction, luminance variation of approximately 5% occurs in the column direction, which is a variation range of about half that of the reference example. Further, the distribution shape of the luminance variation in the column direction is different for each line, and in particular portions having higher than average luminance occur irregularly in the row direction and are not continuous. Thus, luminance variation in the column direction in the gaps 522zG1 to 522zG5 does not form a high luminance band parallel to the row direction, and it can be seen that in the embodiment it is unlikely that this luminance variation is recognized as streaks of luminance unevenness parallel to the row direction.

5. Synopsis

As described above, The organic EL display panel 10 pertaining to at least one embodiment includes the substrate 100x, the pixel electrodes 119, the column banks 522Y, the organic light emitting layers 123, and the counter electrode layer 125. The pixel electrodes 119 are disposed above the substrate 100x and arranged in a matrix of rows and columns. The column banks 522Y are disposed above the substrate 100x at least between edges of the pixel electrodes 119 in a row direction, extending in a column direction and arranged side-by-side in the row direction. The organic light emitting layers 123 are each continuous in the column direction and are disposed in gaps 522z between the column banks 522Y adjacent to each other in the row direction. The counter electrode layer 125 is disposed above the organic light emitting layers 123. Width in the row direction of the organic light emitting layers 123 is defined by width of the gaps 522z between the column banks 522Y. The width in the row direction of each of the organic light emitting layers 123 changes at intervals in the column direction. For each of the organic light emitting layers 123, a minimum interval among the intervals is equal to or less than a pitch in the column direction of the pixel electrodes 119. The changes are different for each of the organic light emitting layers 123. According to at least one embodiment, width in the row direction of each of the column banks 522Y irregularly and/or aperiodically changes at intervals in the column direction. For each of the column banks 522Y, a minimum interval among the intervals is equal to or less than the pitch in the column direction of the pixel electrodes 119, and the changes are different for each of the column banks 522Y.

According to this configuration of a panel structure, by superimposing modulated luminance distribution that varies differently from row direction streaks of luminance unevenness with the row direction streaks of luminance unevenness caused by variation in functional layer film thickness in the column direction that is common across layers in the row direction, the row direction streaks of luminance unevenness are made to stand out less.

6. Modifications

The display panel 10 pertaining to at least one embodiment has been described, but the present disclosure is not limited to the embodiments described above. For example, various modifications conceivable by a person having ordinary skill in the art, and any combination of elements and functions of embodiments and modifications that do not depart from the spirit of the present invention are also included in the present disclosure. The following describes modifications of the display panel 10 as examples of such embodiments.

In the display panel 10, the light emitting layers 123 extend continuously in the column direction over the row banks. However, the light emitting layers 123 may be discontinuous and separated per pixel by the row banks.

Further, in the display panel 10, the colors of light emitted by the light emitting layers 123 of the sub pixels 100se in the gaps 522z between the column banks 522Y that are adjacent in the row direction are configured to be different from each other, and the colors of light emitted by the light emitting layers 123 of the sub pixels 100se in gaps between the row banks 122X that are adjacent in the column direction is configured to be the same. However, the colors of light emitted by the light emitting layers 123 of the sub pixels 100se that are adjacent in the row direction may be the same, and the colors of light emitted by the light emitting layers 123 of the sub pixels 100se that are adjacent in the column direction may be different from each other. Further, the colors may be different from each other for light emitted by the light emitting layers 123 of the sub pixels 100se that are adjacent in the column and row directions.

According to the display panel 10 pertaining to at least one embodiment, there are red pixels, green pixels, and blue pixels among the pixel 100e, but the present invention is not limited to this example. As another example, the light emitting layers may all be of a single type, or there may be four types emitting colors of light such as red, green, blue, and white.

Further, according to at least one embodiment, the unit pixels 100e are arranged in a matrix, but the present invention is limited in this way. For example, the invention is effective even when spacing between pixel regions is at one pitch, and adjacent pixel regions similarly spaced are shifted by a half pitch in the column direction. For high resolution display panels, some shift in the column direction is hard to visually determine, and even if some film thickness variation is lined up on a straight line (or staggered line) of a certain thickness, it will appear as a band. Accordingly, even with such a configuration, display quality of a display panel can be increased by suppressing lining up of luminance unevenness along a staggered line.

Further, according to at least one embodiment, the hole injection layers 120, the hole transport layers 121, the light emitting layers 123, and the electron transport layer 124 are present between the pixel electrodes 119 and the common electrode layer 125, but the present invention is not limited to this configuration. For example, a configuration is possible in which only the light emitting layers 123 are present between the pixel electrodes 119 and the common electrode layer 125, without using the hole injection layers 120, the hole transport layers 121, and the electron transport layer 124. Further, for example, a configuration is possible in which a layer or a plurality of layers selected from the group consisting of hole injection layers, hole transport layers, an electron transport layer, and an electron injection layer are present. Further, all these layers need not be made of organic compounds, and at least one layer may be made of an inorganic compound.

Further, according to at least one embodiment, a wet process such printing, spin coating, inkjets, or the like is used as a method of forming the light emitting layers 123, but the present invention is not limited to these examples. For example, a dry process can be used such as vacuum deposition, electron beam deposition, sputtering, reactive sputtering, ion plating, vapor phase growth, or the like. Further, publicly-known materials may be appropriately adopted as materials of each component.

Further, according to at least one embodiment, a configuration is used in which the pixel electrodes 119, which are anodes, are disposed below the EL element portions and connected to the wiring 110 that is connected to the TFT source electrodes, but a configuration may be used in which a common electrode layer is disposed below the EL element portions and anodes are disposed above. In such a case, cathodes disposed below the EL element portions are connected to drains of the TFTs.

Further, according to at least one embodiment, a configuration is used in which two transistors Tr1, Tr2 are provided for each of the sub pixels 100se, but the present invention is not limited to this. For example, a configuration may be used in which a single transistor or three or more transistors correspond to one sub-pixel.

Further, according to at least one embodiment, a top-emission type of EL display panel is given as an example, but the present invention is not limited to this. For example, a bottom-emission type of the display panel or the like can be used. In such a case, each configuration can be changed appropriately.

<<Supplement>>

The embodiments described above each indicate one beneficial specific example of the present invention. Numerical values, shapes, materials, constituent elements, arrangement positions and connections of constituent elements, steps, order of steps, and the like indicated as embodiments are merely examples and are not intended to limit the present invention. Further, among constituent elements in the embodiments, any elements not described in independent claims representing top level concepts of the present invention are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

Further, the present invention includes various modifications of the embodiments that are within the scope of ideas conceivable by a person skilled in the art.

Although the technology pertaining to the present disclosure has been fully described by way of examples with reference to the accompanying drawings, various changes and modifications will be apparent to those skilled in the art. Therefore, unless such changes and modifications depart from the scope of the present disclosure, they should be construed as being included therein.

What is claimed is:

1. An organic electroluminescence (EL) display panel in which a plurality of pixels are arranged in a matrix of rows and columns, the organic EL display panel comprising:
    a substrate;
    pixel electrodes disposed above the substrate and arranged in the matrix;
    column insulating layers disposed above the substrate at least between edges of the pixel electrodes in a row direction, extending in a column direction and arranged side-by-side in the row direction;
    organic light emitting layers that are each continuous in the column direction and that are disposed in gaps between the column insulating layers adjacent to each other in the row direction; and
    a counter electrode layer disposed above the organic light emitting layers, wherein
    width in the row direction of the organic light emitting layers is defined by width of the gaps between the column insulating layers,
    the width in the row direction of each of the organic light emitting layers changes at intervals in the column direction,
    for each of the organic light emitting layers, a minimum interval among the intervals is equal to or less than a pitch in the column direction of the pixel electrodes, and
    the changes are different for each of the organic light emitting layers.

2. The organic EL display panel of claim 1, wherein
    width in the row direction of each of the column insulating layers irregularly and/or aperiodically changes at intervals in the column direction,
    for each of the column insulating layers, a minimum interval among the intervals is equal to or less than the pitch in the column direction of the pixel electrodes, and
    the changes are different for each of the column insulating layers.

3. The organic EL display panel of claim 2, wherein
    the minimum interval is ⅙ or less of the pitch of the pixel electrodes in the column direction.

4. The organic EL display panel of claim 1, wherein
    the shorter a wavelength of light emitted by a given one of the organic light emitting layers, the greater a range of variation of the width in the row direction of the organic light emitting layer.

5. The organic EL display panel of claim 1, wherein
    an absolute value of a cross-correlation coefficient between two sequences is 0.2 or less, where each of the sequences consists of widths in the row direction of one of the organic light emitting layers at positions in the column direction between a pair of the column insulating layers selected from the column insulating layers.

6. The organic EL display panel of claim 1, wherein
    three of the column insulating layers that are adjacent in the row direction are selected from the column insulating layers and referred to as a first column insulating layer, a second column insulating layer, and a third column insulating layer, and an absolute value of a cross-correlation coefficient between a sequence consisting of widths in the row direction of one of the organic light emitting layers at positions in the column direction between the first column insulating layer and the second column insulating layer and a sequence consisting of widths in the row direction of one of the organic light emitting layers at positions in the column direction between the second column insulating layer and the third column insulating layer is referred to as an adjacent correlation value, and
    an average of adjacent correlation values calculated from the selections of three column insulating layers from the column insulating layers is 0.2 or less.

7. An organic electroluminescence (EL) display panel in which a plurality of pixels are arranged in a matrix, the organic EL display panel comprising:
    a substrate;
    pixel electrodes disposed above the substrate and arranged in the matrix;
    column insulating layers disposed above the substrate at least between edges of the pixel electrodes in a row direction, extending in a column direction and arranged side-by-side in the row direction;
    organic light emitting layers that are each continuous in the column direction and that are disposed in gaps between the column insulating layers adjacent to each other in the row direction; and
    a counter electrode layer disposed above the organic light emitting layers, wherein
    in a rectangular region above the substrate in which at least a defined number of the pixels are arranged in the matrix in the row and column directions,
        width in the row direction of the organic light emitting layers is defined by width of the gaps between the column insulating layers,
        the width in the row direction of each of the organic light emitting layers changes at intervals in the column direction,
        for each of the organic light emitting layers, a minimum interval among the intervals is equal to or less than a pitch in the column direction of the pixel electrodes, and
        the changes are different for each of the organic light emitting layers, and
    the rectangular region is repeated in the column direction.

8. The organic EL display panel of claim 7, wherein
    the rectangular region includes at least five pixels in the row direction and at least ten pixels in the column direction.

9. A method of manufacturing an organic electroluminescence (EL) display panel in which a plurality of pixels are arranged in a matrix of rows and columns, the method comprising:
    preparing a substrate;
    forming pixel electrodes above the substrate arranged in the matrix;

forming column insulating layers above the substrate at least between edges of the pixel electrodes in a row direction, extending in a column direction and arranged side-by-side in the row direction;

forming organic light emitting layers that are each continuous in the column direction by applying an ink including an organic light emitting material into gaps between the column insulating layers; and forming a counter electrode layer above the organic light emitting layers, wherein the column insulating layers are formed to each have a width in the row direction that irregularly and/or aperiodically changes at intervals in the column direction, for each of the column insulating layers, a minimum interval among the intervals is made equal to or less than a pitch in the column direction of the pixel electrodes, and the changes are different for each of the column insulating layers.

10. The method of claim 9, wherein the organic light emitting layers are formed to each have a width in the row direction that changes at intervals in the column direction, for each of the organic light emitting layers, a minimum interval among the intervals is equal to or less than the pitch in the column direction of the pixel electrodes, and the changes are different for each of the organic light emitting layers.

* * * * *